US011894258B2

(12) United States Patent
Tamura et al.

(10) Patent No.: US 11,894,258 B2
(45) Date of Patent: Feb. 6, 2024

(54) SEMICONDUCTOR DEVICE AND MANUFACTURING METHOD THEREOF

(71) Applicant: FUJI ELECTRIC CO., LTD., Kanagawa (JP)

(72) Inventors: Takahiro Tamura, Matsumoto (JP); Michio Nemoto, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/829,306

(22) Filed: May 31, 2022

(65) Prior Publication Data

US 2022/0293775 A1 Sep. 15, 2022

Related U.S. Application Data

(62) Division of application No. 16/992,143, filed on Aug. 13, 2020, now Pat. No. 11,362,202.

(30) Foreign Application Priority Data

Aug. 13, 2019 (JP) .................................. 2019-148604

(51) Int. Cl.
*H01L 21/761* (2006.01)
*H01L 27/06* (2006.01)
(Continued)

(52) U.S. Cl.
CPC ...... *H01L 21/761* (2013.01); *H01L 21/02236* (2013.01); *H01L 21/02255* (2013.01);
(Continued)

(58) Field of Classification Search
CPC . H01L 27/0664; H01L 29/36; H01L 29/4236; H01L 29/47; H01L 29/7397;
(Continued)

(56) References Cited

U.S. PATENT DOCUMENTS 5,162,876 A 11/1992 Kitagawa
9,748,370 B2 * 8/2017 Kumada ............. H01L 29/7397
(Continued)

FOREIGN PATENT DOCUMENTS

CN 102148240 A * 8/2011
JP H04312981 A 11/1992
(Continued)

OTHER PUBLICATIONS

Those references were submitted as IDS or found by the examiner over the earlier U.S. Appl. No. 16/992,143, filed Aug. 13, 2020.

*Primary Examiner* — Eduardo A Rodela

(57) ABSTRACT

There is provided a semiconductor device including: an anode electrode that is provided on a front surface side of a semiconductor substrate; a drift region of a first conductivity type that is provided in the semiconductor substrate; a first anode region of a first conductivity type that is in Schottky contact with the anode electrode; and a second anode region of a second conductivity type that is different from the first conductivity type, in which the first anode region has a doping concentration lower than or equal to a doping concentration of the second anode region, and is spaced from the drift region by the second anode region.

25 Claims, 31 Drawing Sheets

(51) Int. Cl.
  *H01L 21/285* (2006.01)
  *H01L 29/32* (2006.01)
  *H01L 29/36* (2006.01)
  *H01L 29/423* (2006.01)
  *H01L 29/47* (2006.01)
  *H01L 29/872* (2006.01)
  *H01L 29/739* (2006.01)
  *H01L 21/02* (2006.01)
  *H01L 21/265* (2006.01)
  *H01L 21/266* (2006.01)
  *H01L 21/22* (2006.01)
  *H01L 21/225* (2006.01)
  *H01L 29/10* (2006.01)
  *H01L 29/78* (2006.01)
  *H01L 29/66* (2006.01)
  *H01L 21/77* (2017.01)

(52) U.S. Cl.
  CPC ........ *H01L 21/221* (2013.01); *H01L 21/2253* (2013.01); *H01L 21/266* (2013.01); *H01L 21/26513* (2013.01); *H01L 21/28537* (2013.01); *H01L 21/77* (2013.01); *H01L 27/0664* (2013.01); *H01L 29/1095* (2013.01); *H01L 29/32* (2013.01); *H01L 29/36* (2013.01); *H01L 29/4236* (2013.01); *H01L 29/47* (2013.01); *H01L 29/66356* (2013.01); *H01L 29/7391* (2013.01); *H01L 29/7397* (2013.01); *H01L 29/7806* (2013.01); *H01L 29/872* (2013.01); *H01L 29/8725* (2013.01)

(58) Field of Classification Search
  CPC ............. H01L 29/872; H01L 21/28537; H01L 21/28581; H01L 21/823475; H01L 21/823487; H01L 21/823493; H01L 27/0766; H01L 29/0619; H01L 29/0696; H01L 29/0891; H01L 29/1095; H01L 29/66143; H01L 29/66212; H01L 29/66325; H01L 29/66848; H01L 29/7395; H01L 29/7806; H01L 21/77; H01L 21/761
  See application file for complete search history.

(56) References Cited

U.S. PATENT DOCUMENTS

| | | | |
|---|---|---|---|
| 10,930,770 B2 * | 2/2021 | Eckel | ............... H01L 29/66068 |
| 2002/0121663 A1 | 9/2002 | Azam | |
| 2008/0251810 A1 | 10/2008 | Torii | |
| 2014/0217464 A1 | 8/2014 | Higuchi | |
| 2015/0187922 A1 * | 7/2015 | Song | ................ H01L 29/42368 |
| | | | 257/139 |
| 2016/0005605 A1 * | 1/2016 | Nishio | ................ H01L 29/1054 |
| | | | 257/77 |
| 2016/0141402 A1 | 5/2016 | Hosokawa | |
| 2016/0240641 A1 * | 8/2016 | Okawara | ............. H01L 29/7397 |
| 2016/0260807 A1 | 9/2016 | Soeno | |
| 2017/0141103 A1 | 5/2017 | Kameyama | |
| 2017/0250179 A1 | 8/2017 | Senoo | |
| 2018/0248008 A1 | 8/2018 | Sugawara | |
| 2019/0058057 A1 | 2/2019 | Eckel | |
| 2023/0100846 A1 | 3/2023 | Karmous | |

FOREIGN PATENT DOCUMENTS

| | | | |
|---|---|---|---|
| JP | 2014135419 A | * | 7/2014 |
| JP | 2016006891 A | | 1/2016 |
| JP | 2016096304 A | | 5/2016 |
| JP | 2016162950 A | | 9/2016 |

* cited by examiner

SEMICONDUCTOR DEVICE AND MANUFACTURING METHOD THEREOF

CROSS-REFERENCE TO RELATED APPLICATIONS

This application is a divisional of U.S. patent application Ser. No. 16/992,143, filed on Aug. 13, 2020, the entire contents of which is expressly incorporated herein by reference. The application also claims priority from the following Japanese patent applications, which are explicitly incorporated herein by reference:
No. 2019-148604, filed in JP on Aug. 13, 2019, and
No. 2020-131895, filed in JP on Aug. 3, 2020.

BACKGROUND

1. Technical Field

The present invention relates to a semiconductor device and a manufacturing method for a semiconductor device.

2. Related Art

In the related art, a semiconductor device having a diode portion in which a P anode region is shielded by an N layer is known (for example, refer to Patent Literature 1).
[Patent Literature 1] Japanese Unexamined Patent Application Publication No. 2016-6891

GENERAL DISCLOSURE

Reverse recovery characteristics of a semiconductor device are to be enhanced.

A first aspect of the present invention provides a semiconductor device including:
an anode electrode that is provided on a front surface side of a semiconductor substrate; a drift region of a first conductivity type that is provided in the semiconductor substrate; a first anode region of a first conductivity type that is in Schottky contact with the anode electrode; and a second anode region of a second conductivity type that is different from the first conductivity type, in which the first anode region has a doping concentration lower than or equal to a doping concentration of the second anode region, and is spaced from the drift region by the second anode region.

The doping concentration of the first anode region may be 1E15 $cm^{-3}$ or higher and 1E18 $cm^{-3}$ or lower.

On a front surface of the semiconductor substrate, an area of the first anode region may be greater than an area of the second anode region.

A depth of a lower end of the first anode region may be shallower than half a depth of a lower end of the second anode region.

A depth of a lower end of the first anode region may be deeper than half a depth of a lower end of the second anode region, and may be shallower than the depth of the lower end of the second anode region.

A thickness of the second anode region in a depth direction below the first anode region may be equal to or greater than 0.5 μm.

A depth of a lower end of the second anode region in a region in contact with the anode electrode may be shallower than a depth of a lower end of the second anode region provided below the first anode region.

A shallowest portion of the lower end of the second anode region may be located at the center of the region where the second anode region is in contact with the anode electrode in the top plan view.

A doping concentration of the second anode region in contact with the anode electrode may be lower than the doping concentration of the first anode region.

The semiconductor device may further include a plurality of trench portions. The first anode region may be provided in a mesa portion of the semiconductor substrate that is provided between the plurality of trench portions, and is in contact with the plurality of trench portions at both ends of the mesa portion.

The first anode region and the second anode region may be alternately arranged in a mesa longitudinal direction.

On a front surface of the semiconductor substrate, an area of the second anode region may be equal to or smaller than 1% of a total area of the mesa portion interposed between the plurality of trench portions.

In any mesa portion of a plurality of mesa portions interposed between the plurality of trench portions, an upper surface of the second anode region may be entirely covered with the first anode region.

The plurality of trench portions may have structures in which a trench width gradually increases from a front surface toward a rear surface of the semiconductor substrate. A width of the mesa portion on the front surface may be smaller than a maximum trench width of the plurality of trench portions.

The semiconductor device may include a plurality of accumulation regions of a first conductivity type that have a higher doping concentration than a doping concentration of the drift region. A depth of a lower end of the first anode region may be deeper than half a depth of a lower end of the second anode region. The depth of the lower end of the second anode region may be smaller than a thickness from an upper end to a lower end of the plurality of accumulation regions.

A lower end of a deepest accumulation region of the plurality of accumulation regions may be deeper than half a depth position of an adjacent trench portion of the plurality of trench portions, and may have a depth which is the same as or shallower than a depth of a boundary between a sidewall region where the trench portion extends toward a rear surface of the semiconductor substrate, and a bottom region where a width of the trench portion decreases toward a bottom portion of the trench portion.

The semiconductor device may include an accumulation region of a first conductivity type that has a higher doping concentration than a doping concentration of the drift region. A lower end of the accumulation region may be deeper than half a depth position of an adjacent trench portion of the plurality of trench portions, and may have a depth which is the same as or shallower than a depth of a boundary between a sidewall region where the trench portion extends toward a rear surface of the semiconductor substrate, and a bottom region where a width of the trench portion decreases toward a bottom portion of the trench portion. A depth of a lower end of the first anode region may be deeper than half a depth of a lower end of the second anode region. The depth of the lower end of the second anode region may be smaller than a thickness from an upper end to the lower end of the accumulation region.

The semiconductor device may include an accumulation region of a first conductivity type having a higher doping concentration than a doping concentration of the drift region. The accumulation region may be provided below the first anode region and the second anode region.

The semiconductor device may include: a cathode electrode that is provided on a rear surface side of the semiconductor substrate; and a cathode layer that is provided in contact with the cathode electrode on a rear surface of the semiconductor substrate. The cathode layer may include: a first cathode region of a first conductivity type; and a second cathode region of a second conductivity type that is provided in direct contact with the first cathode region.

On a rear surface of the semiconductor substrate, an area of the second cathode region may be greater than an area of the first cathode region.

On a rear surface of the semiconductor substrate, an area of the first cathode region may be equal to or smaller than 10% of a total area of the first cathode region and the second cathode region.

The cathode layer may include: a rear surface side cathode portion that is provided in the semiconductor substrate; and
a front surface side cathode portion of a second conductivity type that is provided closer to the front surface side of the semiconductor substrate than the rear surface side cathode portion is. The rear surface side cathode portion may have a repeated structure of the first cathode region and the second cathode region.

The front surface side cathode portion may be provided in direct contact with the first cathode region and the second cathode region, and may have an opening that is provided on a front surface side of the first cathode region.

A diameter D of the opening may be smaller than a width C of the first cathode region in a trench array direction.

The semiconductor device may include a connection portion for connecting the first anode region and the anode electrode. The connection portion may include at least one of Ti, V, Ni, and Pt.

The semiconductor device may further include a transistor portion that is provided in the semiconductor substrate.

A second aspect of the present invention provides a manufacturing method for a semiconductor device, the manufacturing method including: providing an anode electrode on a front surface side of a semiconductor substrate; providing a drift region of a first conductivity type in the semiconductor substrate; providing a first anode region of a first conductivity type that is in Schottky contact with the anode electrode; and providing a second anode region of a second conductivity type that is different from the first conductivity type, in which the first anode region has a doping concentration lower than or equal to a doping concentration of the second anode region, and is spaced from the drift region by the second anode region.

The summary clause does not necessarily describe all necessary features of the embodiments of the present invention. The present invention may also be a sub-combination of the features described above.

DESCRIPTION OF EXEMPLARY EMBODIMENTS

Figure 1A:
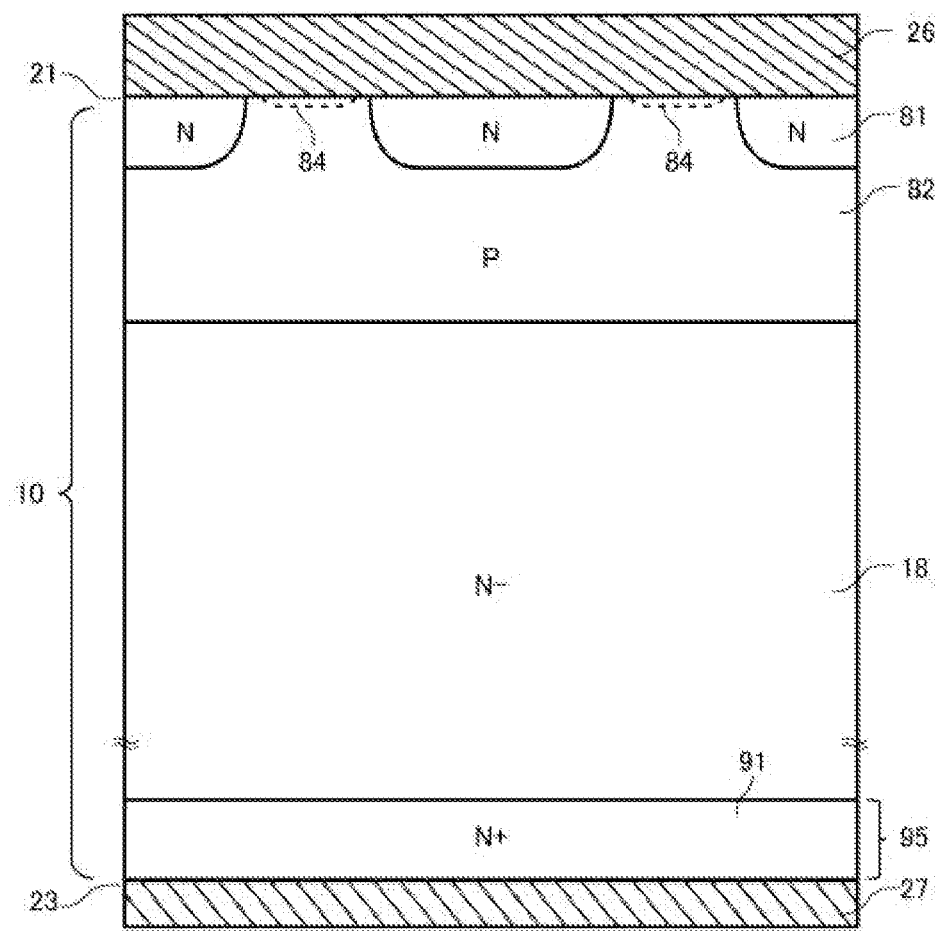
FIG. 1A shows an example of a cross-sectional view of a semiconductor device 100 of a planar type.
Figure 1A:

Hereinafter, the invention will be described through embodiments of the invention, but the following embodiments do not limit the invention according to the claims. Further, not all the combinations of features described in the embodiments are essential for means to solve the problem in the invention.

In the present specification, one side in a direction parallel to a depth direction of a semiconductor substrate is referred to as an "upper" side, and the other side is referred to as a "lower" side. One surface of two principal surfaces of a substrate, a layer or another member is referred to as an upper surface, and the other surface is referred to as a lower surface. "Upper" and "lower" directions are not limited to a direction of gravity, or a mounting direction of a semiconductor device when the semiconductor device is mounted.

In the present specification, technical matters may be described using orthogonal coordinate axes of an X axis, a Y axis, and a Z axis. The orthogonal coordinate axes merely specify relative positions of components and do not limit a specific direction. For example, a direction that the Z axis shows is not limited to a height direction with respect to the ground. Note that ay +Z axis direction and a −Z axis direction are directions opposite to each other. In a case where the Z axis direction is described without a description of positive and negative signs, the direction means a direction parallel to the +Z axis and the −Z axis.

In the present specification, orthogonal axes parallel to the upper surface and the lower surface of the semiconductor substrate are defined as the X axis and the Y axis. Further, an axis perpendicular to the upper surface and the lower surface of the semiconductor substrate is defined as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

In the present specification, a case where a term such as "same" or "equal" is mentioned may include an error due to a variation in manufacturing or the like. The error is, for example, within 10%.

In the present specification, a conductivity type of doping region doped with impurities is described as a P type or an N type. In the present specification, an impurity may particularly mean either a donor of an N type or an acceptor of a P type, and may be described as a dopant. In the present specification, doping means introducing the donor or the acceptor into the semiconductor substrate and turning it into a semiconductor presenting a conductivity of the N type or a conductivity of the P type.

In the present specification, a doping concentration means a concentration of the donor or a concentration of the acceptor in a thermal equilibrium state. In the present specification, a net doping concentration means a net concentration obtained by adding the donor concentration as a positive ion concentration to the acceptor concentration as a negative ion concentration, taking into account of polarities of charges. As an example, when the donor concentration is $N_D$ and the acceptor concentration is $N_A$, the net doping concentration at any position is given as $N_D - N_A$.

The donor has a function of supplying electrons to the semiconductor. The acceptor has a function of receiving electrons from the semiconductor. The donor and acceptor are not limited to the impurities themselves. For example, a VOH defect which is a combination of a vacancy (V), oxygen (O) and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

Further, when concentration distribution of the donor, acceptor, or net doping has a peak in a region, a value of the peak may be set to be the concentration of the donor, acceptor, or net doping in the region. In a case where the concentration of the donor, acceptor or net doping is substantially uniform in a region, or the like, an average value of the concentration of the donor, acceptor or net doping in the region may be set to be the concentration of the donor, acceptor or net doping.

FIG. 1A shows an example of a cross-sectional view of a semiconductor device 100 of a planar type. The semiconductor device 100 includes a semiconductor substrate 10. The semiconductor device 100 is a semiconductor chip having a diode. The semiconductor device 100 of the present example includes a drift region 18, a first anode region 81, a second anode region 82, and a contact region 84 in the semiconductor substrate 10. Further, the semiconductor device 100 also includes a front surface side electrode 26 and a rear surface side electrode 27.

The semiconductor substrate 10 is a substrate formed of a semiconductor material. The semiconductor substrate 10 may be a silicon substrate, a silicon carbide substrate, or a nitride semiconductor substrate such as a gallium nitride semiconductor substrate. The semiconductor substrate 10 of the present example is a silicon substrate. The semiconductor substrate 10 has a front surface 21 and a rear surface 23.

Further, the semiconductor substrate 10 may be a substrate of an N type, or may be a substrate which is obtained by converting a substrate of a P type into a substrate of an N type. The semiconductor substrate 10 may be a wafer cut out from a semiconductor ingot, or may be a chip obtained by dicing the wafer. The semiconductor ingot may be manufactured by any of the Czochralski method (the CZ method), the magnetic field applied Czochralski method (the MCZ method), and the float zone method (the FZ method). In the present example, the semiconductor substrate 10 is a wafer cut out from an ingot manufactured by the MCZ method.

The drift region 18 is a region of a first conductivity type that is provided in the semiconductor substrate 10. The drift region 18 in the present example is of the N− type, for example. The drift region 18 may be a residual region where another doping region is not formed in the semiconductor substrate 10. That is, a doping concentration of the drift region 18 may be a doping concentration of the semiconductor substrate 10.

The front surface side electrode 26 is provided on a front surface 21 side of the semiconductor substrate 10. The front surface side electrode 26 of the present example is provided in contact with the front surface 21 side of the semiconductor substrate 10. The front surface side electrode 26 is formed of a material including metal. For example, at least a portion of a region of the front surface side electrode 26 is formed of aluminum, an aluminum-silicon alloy, or an aluminum-silicon-copper alloy. The front surface side electrode 26 may have a barrier metal formed of titanium, a titanium compound, or the like below a region formed of aluminum or the like. As an example, the front surface side electrode 26 is an anode electrode.

The rear surface side electrode 27 is provided on a rear surface 23 side of the semiconductor substrate 10. The rear surface side electrode 27 of the present example is provided in contact with the rear surface 23 of the semiconductor substrate 10. The rear surface side electrode 27 is formed of a conductive material such as metal. The material of the rear surface side electrode 27 may be the same as or different from the material of the front surface side electrode 26. For example, at least a portion of a region of the rear surface side electrode 27 is formed of aluminum, an aluminum-silicon alloy, or an aluminum-silicon-copper alloy. As an example, the rear surface side electrode 27 is a cathode electrode.

A cathode layer 95 is provided on the rear surface 23 side of the semiconductor substrate 10. The cathode layer 95 is electrically connected to the rear surface side electrode 27. The cathode layer 95 of the present example includes a first cathode region 91. Although the cathode layer 95 of the present example has a region of a first conductivity type, the cathode layer 95 may have a region of a second conductivity type.

The first cathode region 91 is a region of a first conductivity type. The first cathode region 91 is, for example, of the N+ type. The first cathode region 91 of the present example is provided on the entire rear surface 23, but it may be selectively provided on part of the rear surface 23. For example, a doping concentration of the first cathode region 91 is 1E19 cm$^{-3}$ or higher. Note that E means a power of 10, and for example, 1E19 cm$^{-3}$ means $1\times10^{19}$ cm$^{-3}$.

The first anode region 81 is a region of a first conductivity type that is in Schottky contact with the front surface side electrode 26. The Schottky contact is achieved by appropriately adjusting the doping concentration of the first anode region 81. For example, the doping concentration of the first anode region 81 is 1E15 cm$^{-3}$ or higher and 1E18 cm$^{-3}$ or lower. When the doping concentration of the first anode region 81 is higher than 1E19 cm$^{-3}$, an ohmic contact may occur. The first anode region 81 of the present example has a doping concentration lower than or equal to the doping concentration of the second anode region 82.

The second anode region 82 is a region of a second conductivity type. The second anode region 82 of the present example is provided on the front surface 21 side of the semiconductor substrate 10. The second anode region 82 is electrically connected to the front surface side electrode 26. At least part of the second anode region 82 is in contact with the front surface side electrode 26. For example, the doping concentration of the second anode region 82 is 1E16 cm$^{-3}$ or higher and 1E17 cm$^{-3}$ or lower.

The first anode region 81 is spaced from the drift region 18 by the second anode region 82. A side surface and a lower surface of the first anode region 81 are covered with the second anode region 82. That is, the semiconductor device 100 has a structure in which the first anode region 81, the second anode region 82, and the drift region 18 are provided in the stated order in the depth direction. In this way, the first anode region 81 may be spaced from the drift region 18 without being in contact with the drift region 18 with at least the second anode region 82 interposed therebetween. A thickness of the second anode region 82 in the depth direction below the first anode region 81 is set in consideration of extending of a depletion layer. That is, the thickness of the second anode region 82 is set such that the depletion layer generated at a PN junction between the second anode region 82 and the drift region 18 does not come into contact with the first anode region 81. As an example, the thickness of the second anode region 82 in the depth direction below the first anode region 81 is equal to or greater than 0.5 μm.

The contact region 84 is provided on the front surface 21 side of the second anode region 82. The contact region 84 is a region of a second conductivity type. The contact region 84 is in contact with the front surface side electrode 26. A depth of the the contact region 84 may be shallower than a depth of the first anode region 81. The depth of the contact region 84 may be shallower than 10% of the depth of the first anode region 81. The depth of the contact region 84 may be 0.1 μm or less. The depth of the contact region 84 may be deeper than the Debye length. The depth of the contact region 84 may be 100 times the Debye length or shallower. The contact region 84 may include fluorine in addition to a dopant of a second conductivity type (boron, aluminum, or the like). The semiconductor device 100 may not include the contact region 84.

A doping concentration of the contact region 84 may be higher than the doping concentration of the second anode region 82. The doping concentration of the contact region 84 may be 100 times or higher a maximum value of the doping concentration of the second anode region 82. The doping concentration of the contact region 84 may be 1E18 cm$^{-3}$ or higher, or 1E20 cm$^{-3}$ or lower.

The contact region 84 is adjacent to the first anode region 81 in a top plan view. The contact region 84 may be in contact with the first anode region 81, or may be spaced from the first anode region 81 in the top plan view. In the present example, the contact region 84 is spaced from the first anode region 81. In the top plan view, the second anode region 82 may be exposed to the front surface 21 between the contact region 84 and the first anode region 81.

A contact between the second anode region 82 and the front surface side electrode 26 may be ohmic contact. By making the contact between the second anode region 82 and the front surface side electrode 26 be the ohmic contact, the contact region 84 has an effect of reducing a contact resistance. On the other hand, since the contact region 84 has a higher doping concentration than that of the second anode region 82, an amount of holes injected from the second anode region 82 to the drift region 18 may be increased. By setting the depth of the contact region 84 to a predetermined magnitude, it is possible to suppress the injection amount of holes even when the contact region 84 is included. Further, by setting the doping concentration of the contact region 84 to a predetermined magnitude, it is possible to suppress the injection amount of holes even when the contact region 84 is included. Note that in a case where the second anode region 82 and the front surface side electrode 26 are in direct contact with each other, when the contact between the second anode region 82 and the front surface side electrode 26 is the ohmic contact, the contact region 84 may not be included.

As described above, the semiconductor device 100 includes the first anode region 81 and the second anode region 82 on the front surface 21. On the front surface 21, the area of the first anode region 81 may be greater than the area of the second anode region 82. The areas of the first anode region 81 and the second anode region 82 are expressed by an area ratio α. The area ratio α is a ratio of the area of the second anode region 82 to the total area of the first anode region 81 and the second anode region 82.

At the time of a forward bias, since the contact of the first anode region 81 with the front surface side electrode 26 is the Schottky contact, minority carriers are less accumulated and less holes are injected from the second anode region 82. The hole injection efficiency when a diode is forward-biased is determined by the area ratio α between the first anode region 81 and the second anode region 82 on the front surface 21. By enlarging the area ratio of the first anode region 81, the hole injection efficiency can be reduced. Further, the first anode region 81 that is in Schottky contact does not increase a leak current. Therefore, a may be equal to or less than 1%. In this way, the hole injection efficiency can be reduced.

At the time of a reverse bias, a depletion layer extending from a Schottky contact surface to the first anode region 81 is preferably not connected to a depletion layer extending from the PN junction between the drift region 18 and the second anode region 82 to the second anode region 82. In this case, the leak current can be further reduced by recombination in the second anode region 82.

Figure 1B:
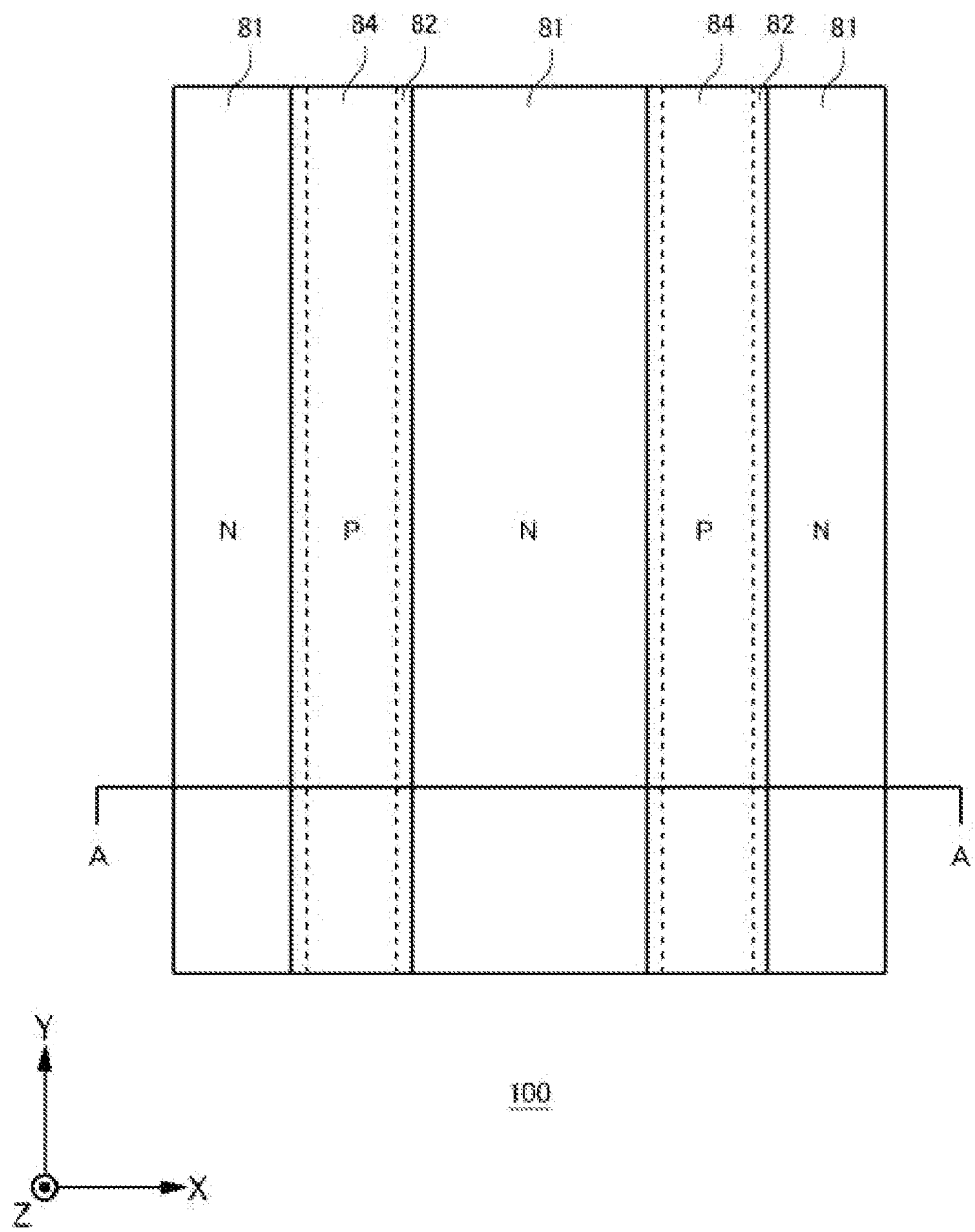
FIG. 1B shows an example of a top plan view of the semiconductor device 100 according to Example 1.

FIG. 1B shows an example of a top plan view of the semiconductor device 100 according to Example 1. The top plan view of the present example is an example of the top plan view of the semiconductor device 100 in FIG. 1A. A cross section A-A in FIG. 1B corresponds to FIG. 1A. The semiconductor device 100 includes, on the front surface 21 of the semiconductor substrate 10, the first anode region 81 and the second anode region 82 that are provided in a stripe pattern. As shown by the dashed line, the contact region 84 may be included on the front surface 21 side of the second anode region 82.

The first anode region 81 extends in the Y axis direction on the front surface 21. Similarly, the second anode region 82 extends in the Y axis direction on the front surface 21. The first anode region 81 and the second anode region 82 are alternately provided in the X axis direction. The width of the first anode region 81 in the X axis direction is greater than the width of the second anode region 82 in the X axis direction. That is, on the front surface 21 of the semiconductor substrate 10, the area of the first anode region 81 is greater than the area of the second anode region 82. For example, on the front surface 21, the area of the first anode region 81 is twice the area of the second anode region 82.

Figure 1C:
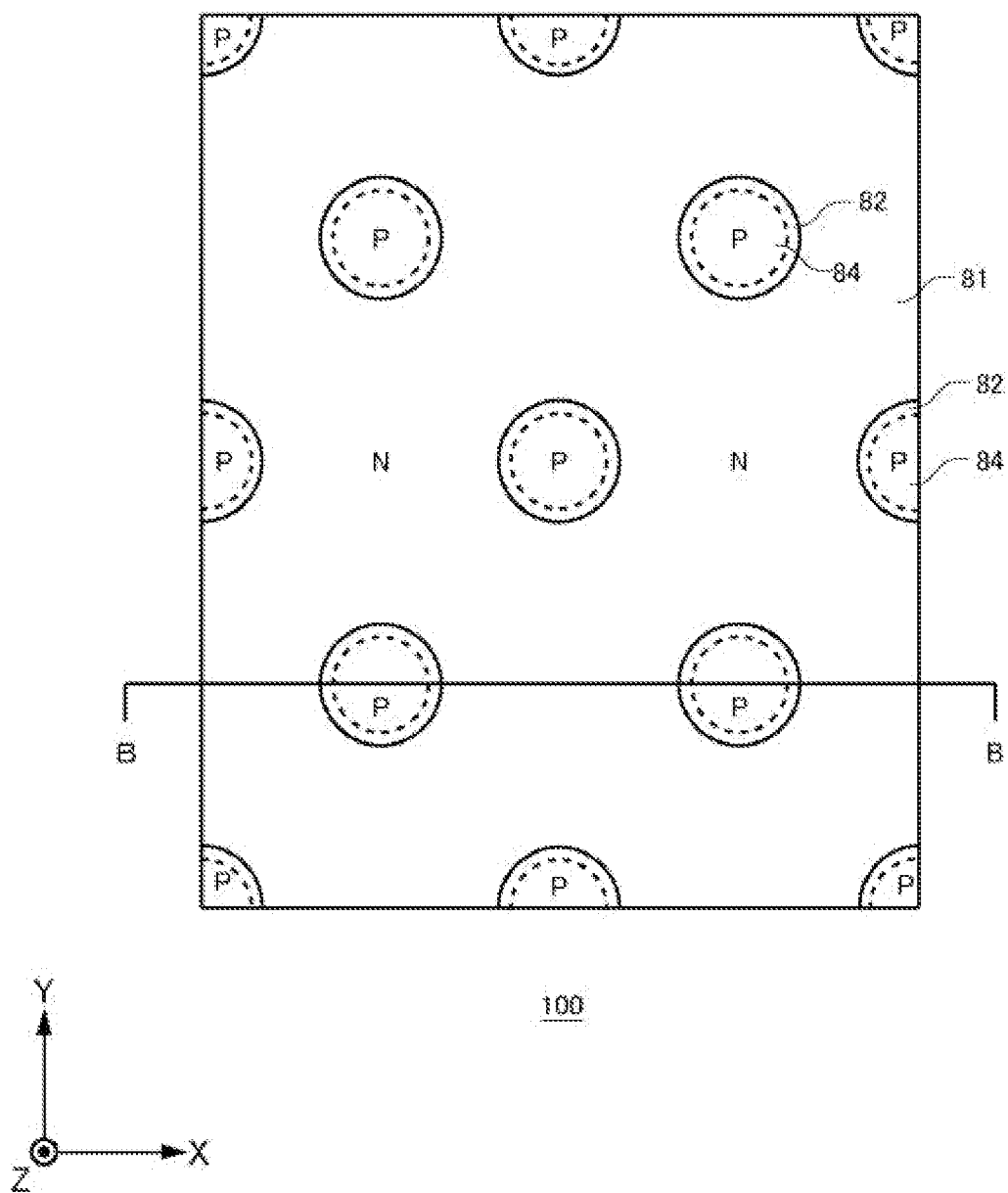
FIG. 1C shows an example of a top plan view of the semiconductor device 100 according to Example 2.

FIG. 1C shows an example of a top plan view of the semiconductor device 100 according to Example 2. The top plan view of the present example is another example of the top plan view of the semiconductor device 100 in FIG. 1A. A cross section B-B in FIG. 1C corresponds to FIG. 1A. The semiconductor device 100 of the present example is different from Example 1 of FIG. 1B in that the second anode region 82 has a circular shape. As shown by the dashed line, the contact region 84 may be included on the front surface 21 side of the second anode region 82.

The second anode region 82 has a perfect circular shape with a predetermined diameter on the front surface 21. The shape of the second anode region 82 may be an ellipse, or a shape other than the circular shape. The second anode region 82 is regularly provided on the front surface 21. For example, the second anode region 82 has a structure in which four perfect circles are arranged at equal intervals with respect to one perfect circle. Otherwise, the arrangement of the second anode region 82 may be irregular.

Figure 1D:
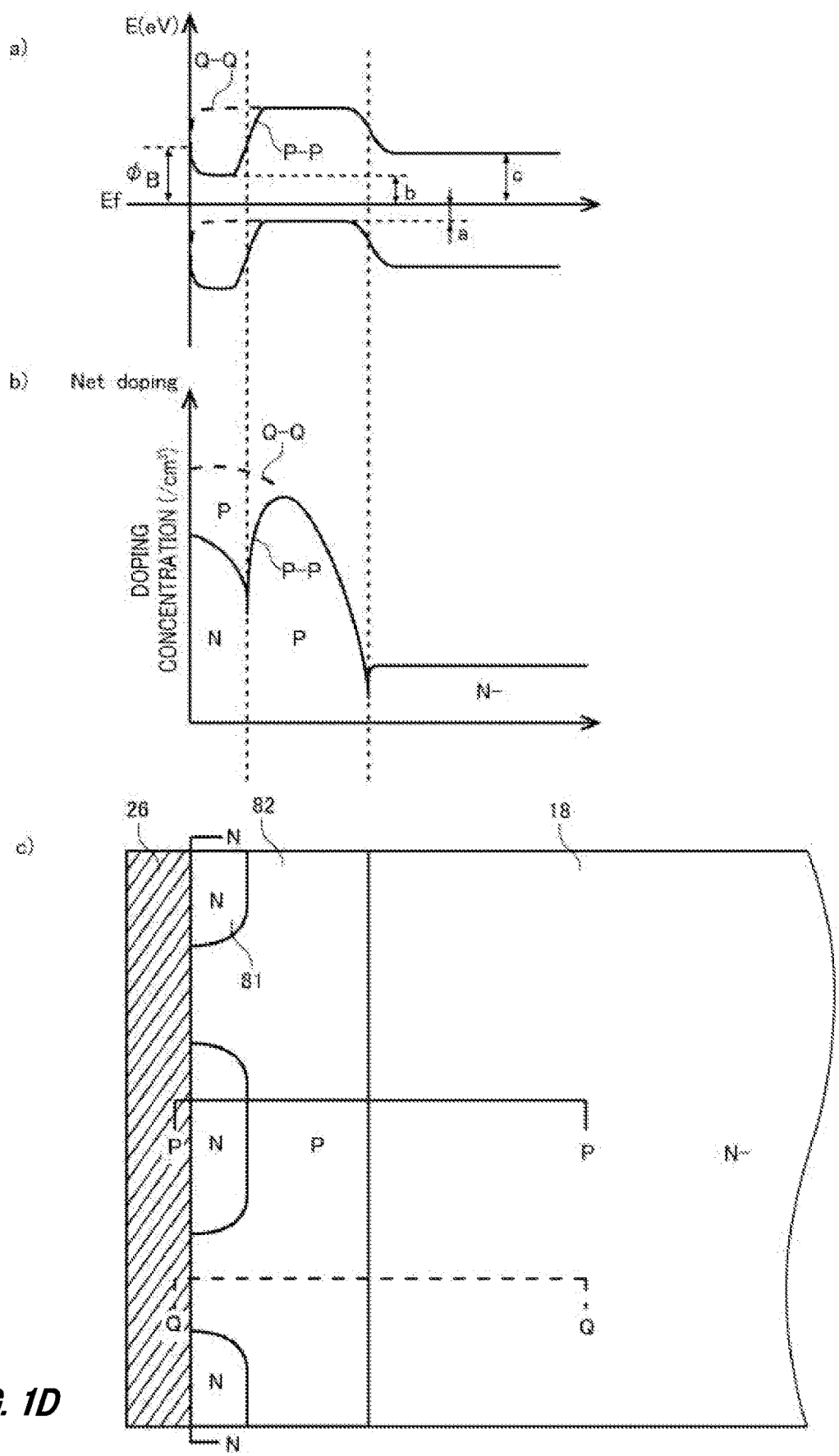
FIG. 1D shows examples of doping concentration distribution and a band diagram of the semiconductor device 100 in a depth direction.

FIG. 1D shows an example of a cross-sectional view c) of the semiconductor device 100, and examples of doping concentration distribution b) and an energy band diagram a) of the semiconductor device 100 in a depth direction. In a) to c) of FIG. 1D, the positions of the depth direction correspond to each other. FIG. 1D corresponds to a case where the contact region 84 is not included. FIG. 1D shows examples of doping concentration distribution and an energy band diagram of the semiconductor device 100 at line P-P and line Q-Q. The vertical axis of the energy band diagram represents energy of an electron or a hole, and the unit of the energy is electron volt (eV) as an example. The Fermi level (Ef) exists in the band gap (a forbidden band). A band above the band gap is a conduction band, and a band below the band gap is a valence band. The vertical axis of the doping concentration represents doping concentration in a common logarithmic scale. The unit of the doping concentration is $cm^{-3}$ as an example. A horizontal axis of the doping concentration represents a depth position in a direction from the front surface 21 that serves as the origin toward the rear surface 23. The unit of the depth position is µm as an example.

The line P-P corresponds to a cross section passing through a region, on the front surface 21, where the first anode region 81 is provided. The line Q-Q corresponds to a cross section passing through a region, on the front surface 21, where the second anode region 82 is provided.

The solid line of the doping concentration shows the distribution of the doping concentration at the line P-P. The first anode region 81 is provided by implanting a predetermined dose of a dopant from the front surface 21. The doping concentration of the first anode region 81 shows a peak near the front surface 21 and decreases toward the depth direction. The dashed line of the doping concentration shows the distribution of the doping concentration at the line Q-Q.

The solid line in the band diagram a) shows the band diagram in a thermal equilibrium state at the line P-P. The first anode region 81 is in Schottky contact with the front surface side electrode 26. On the front surface 21, a Schottky barrier of φB is formed from the Fermi level. By bringing the first anode region 81 into a Schottky contact, hole injection at the time of forward bias can be suppressed. On the other hand, even at the time of the reverse bias, the leak current can be suppressed by the depletion layer extending from the Schottky contact surface to the first anode region 81.

The doping concentration of the first anode region 81 is set to a concentration at which the first anode region 81 is in Schottky contact with the front surface side electrode 26. When the doping concentration of the first anode region 81 becomes higher than $1E18/cm^{-3}$, the thickness of the Schottky barrier in the depth direction becomes thin, which allows a tunnel current to flow. Therefore, the first anode region 81 comes into ohmic contact with the front surface side electrode 26. Accordingly, the doping concentration of the first anode region 81 is set to be lower than $1E18/cm^{-3}$.

An energy difference c between the Fermi level Ef and a bottom of a conduction band of the drift region 18 may be greater than an energy difference b between the Fermi level Ef and a bottom of a conduction band of the first anode region 81. The energy difference b between the Fermi level Ef and the bottom of the conduction band of the first anode region 81 may be greater than an energy difference a between a top of a valence band of the second anode region 82 and the Fermi level Ef. The doping concentration of the first anode region 81 may be lower than the doping concentration of the second anode region 82. Due to this concentration difference, the energy difference b between the bottom of the conduction band of the first anode region 81 and the Fermi level Ef can be greater than the energy difference a between the top of the valence band of the second anode region 82 and the Fermi level Ef. This makes it possible to prevent the ohmic contact which occurs due to the thickness of the Schottky barrier in the depth direction being too thin between the first anode region 81 and the front surface side electrode 26. That is, it is possible for the first anode region 81 and the front surface side electrode 26 to firmly form the Schottky contact so as to sufficiently reduce the hole injection into the drift region 18 at the time of the forward bias.

The dashed line in the band diagram a) shows the band diagram in a thermal equilibrium state at the line Q-Q. The second anode region 82 is in ohmic contact with the front surface side electrode 26. The second anode region 82 may be provided with a region having a high doping concentration on the front surface 21 of the semiconductor substrate 10.

Hydrogen that terminates a dangling bond may be included at an interface between the first anode region 81 and the front surface side electrode 26. This makes it possible to reduce the leak current which is due to a defect of the Schottky contact (that is, the dangling bond) at the time of the reverse bias. Hydrogen in the buffer region 20, which will be described below, may terminate the dangling bond at the interface between the first anode region 81 and the front surface side electrode 26. Hydrogen in the buffer region 20 can diffuse toward the front surface 21 by annealing at 300° C. to 400° C., and can reach the interface between the first anode region 81 and the front surface side electrode 26.

Figure 1E:
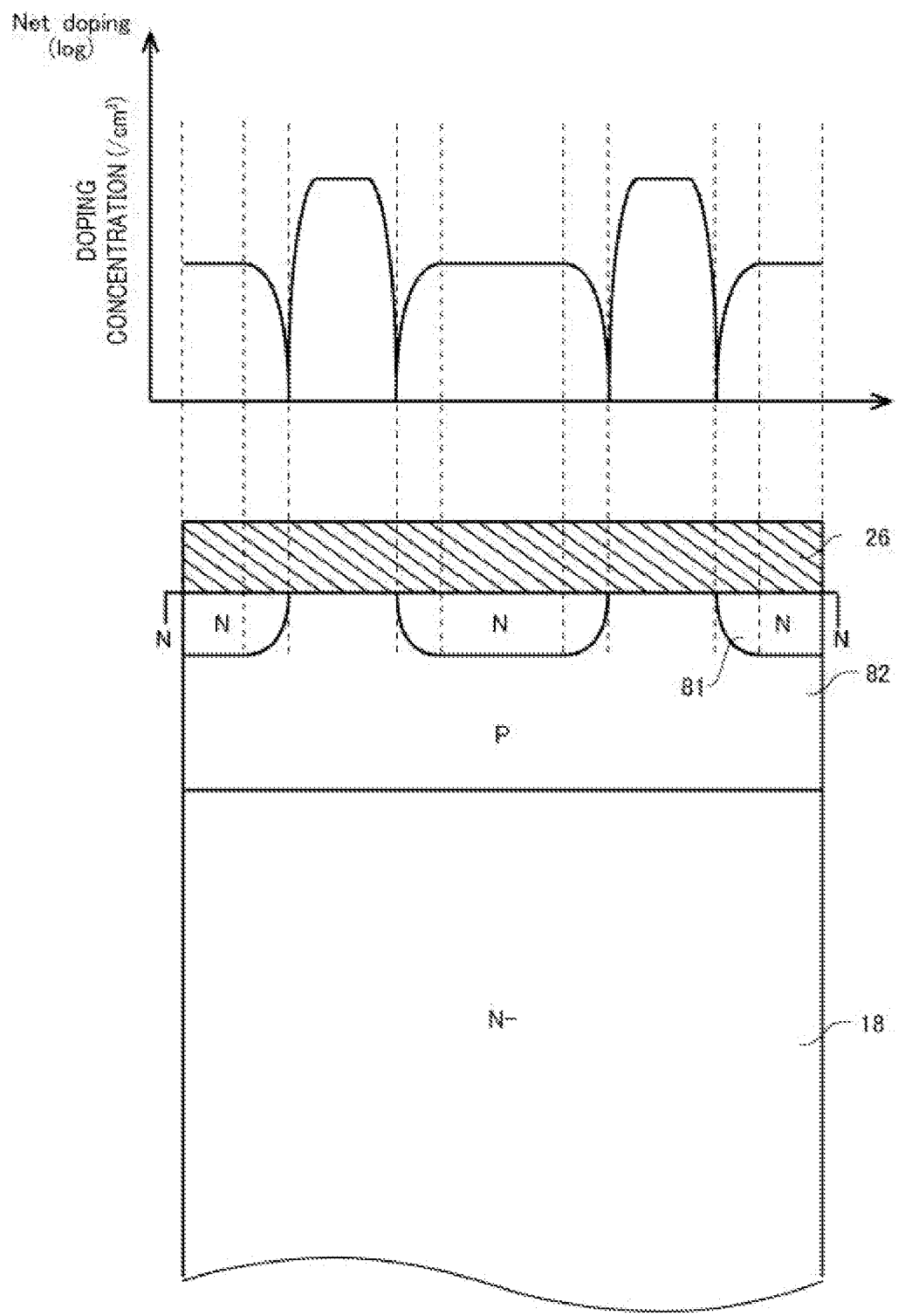
FIG. 1E shows net doping concentration distribution of a front surface 21 in a cross section N-N of c) of FIG. 1D.

FIG. 1E shows net doping concentration distribution of a front surface 21 in a cross section N-N of c) of FIG. 1D. FIG. 1E also corresponds to the case where the contact region 84 is not included. The first anode region 81 has doping concentration distribution that is substantially flat in the X axis direction. The doping concentration distribution of the first anode region 81 decreases near a position where a PN junction with the second anode region 82 is exposed on the front surface 21. The second anode region 82 has doping concentration distribution that is substantially flat in the X axis direction. The doping concentration distribution of the second anode region 82 decreases near the position where the PN junction with the first anode region 81 is exposed on the front surface 21. A maximum doping concentration of the first anode region 81 on the front surface 21 may be lower than a maximum doping concentration of the second anode region 82 on the front surface 21.

Figure 2A:
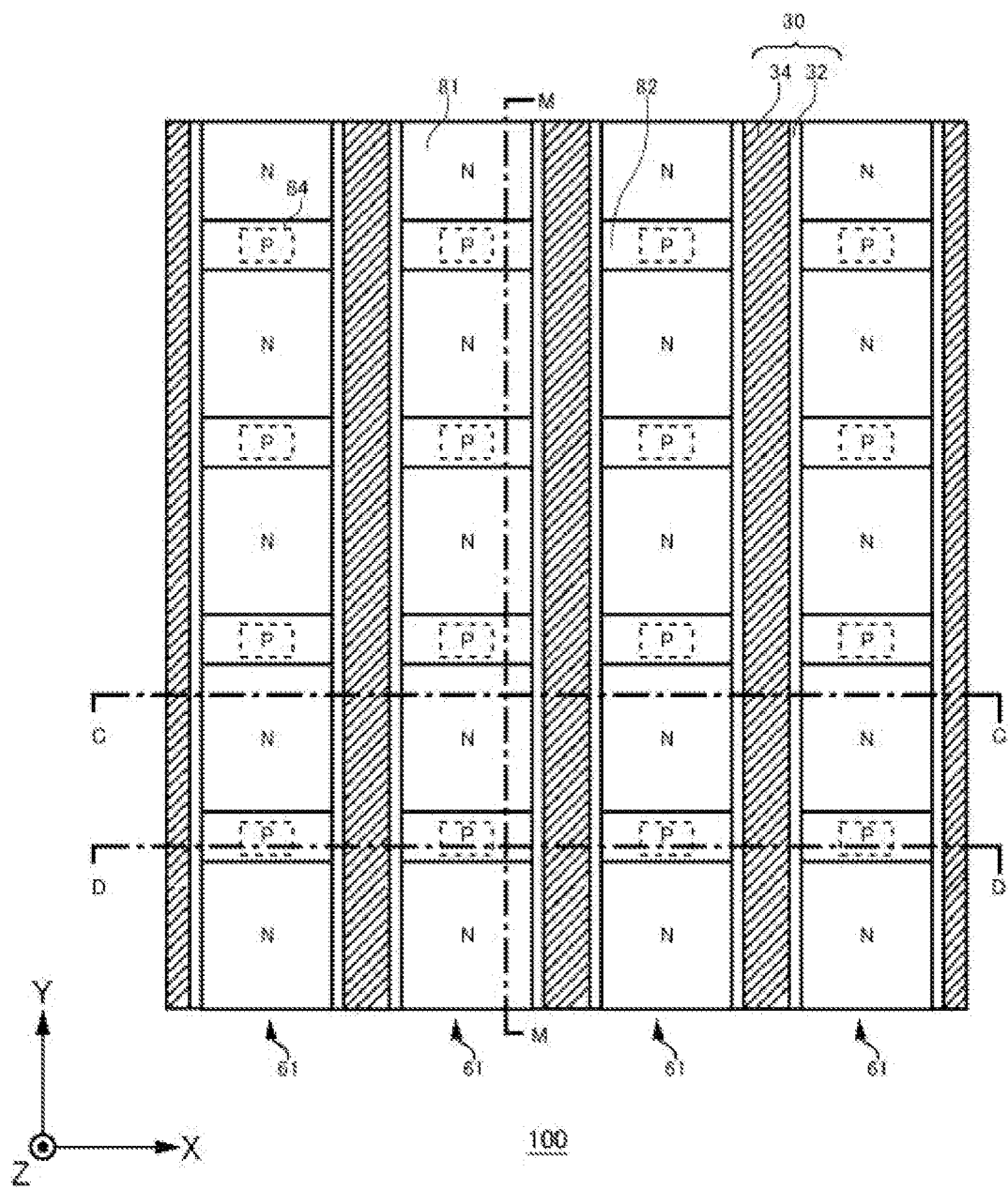
FIG. 2A shows an example of a top plan view of the semiconductor device 100 of a trench type.

FIG. 2A shows an example of a top plan view of the semiconductor device 100 of a trench type. The semiconductor device 100 of the present example has a trench type structure. The semiconductor device 100 has a plurality of dummy trench portions 30. As shown by the dashed line, the contact region 84 may be included on the front surface 21 side of the second anode region 82. Note that in FIG. 2A, an illustration of an electrode and an interlayer dielectric film which are provided above the front surface 21 is omitted.

The first anode region 81 is provided in a mesa portion 61 of the semiconductor substrate 10, that is provided between the plurality of dummy trench portions 30, and is in contact with the plurality of dummy trench portions 30 at both ends of the mesa portion 61. In this case, a surface electric field of the first anode region 81 is relaxed by a RESURF effect of a trench. The dummy trench portion 30 of the present example includes a dummy dielectric film 32 and a dummy conductive portion 34.

A mesa portion refers to a region interposed between trench portions inside the semiconductor substrate 10. For example, the mesa portion 61 is a region of the semiconductor substrate 10 that is interposed between the dummy trench portions 30. As an example, an upper end of the mesa portion is the front surface 21 of the semiconductor substrate 10. The depth position of the lower end of the mesa portion is the same as the depth position of a lower end of a trench portion.

The first anode region 81 and the second anode region 82 are alternately arranged in a mesa longitudinal direction. That is, the second anode region 82 is interposed between first anode regions 81 in the mesa longitudinal direction. The second anode region 82 is provided in the depth direction of the first anode region 81 (a direction on a negative side of the Z axis), and is integrally formed with the second anode region 82 that is exposed on the front surface 21. The mesa longitudinal direction is an extension direction of the trench (that is, the Y axis direction). On the front surface 21, the area of the first anode region 81 is greater than the area of the second anode region 82 exposed on the front surface 21. In the present example, although the area ratio between the first anode region 81 and the second anode region 82 is the same in each mesa portion, it may be different for each mesa portion.

As an example, the ratio between a width of the first anode region 81 in the Y axis direction and a width of the second anode region 82 in the Y axis direction is 3:1. The ratio between the width of the first anode region 81 in the Y axis direction and the width of the second anode region 82 in the Y axis direction may be 2:1, 4:1, 5:1, 9:1, 19:1, 49:1, 99:1, 199:1, or 999:1. The ratio may be different within the same mesa portion.

For example, on the front surface 21 of any of the mesa portions 61 interposed between the plurality of dummy trench portions 30, the area of the second anode region 82 may be equal to or smaller than 30% (corresponding to 2:1), equal to or smaller than 25% (corresponding to 3:1), equal to or smaller than 20% (corresponding to 4:1), equal to or smaller than 10% (corresponding to 9:1), equal to or smaller than 5% (corresponding to 19:1), equal to or smaller than 2% (corresponding to 49:1), equal to or smaller than 1% (corresponding to 99:1), equal to or smaller than 0.5% (corresponding to 199:1), or equal to or smaller than 0.1% (corresponding to 999:1) of the total area. Further, on the front surface 21 of any of the mesa portions 61 interposed between the plurality of dummy trench portions 30, the area of the second anode region 82 may be equal to or smaller than 0.01% of the total area.

Note that along the M-M line, the mesa portion 61 extends in the Y axis direction. A YZ cross section taken along the M-M line may have the same structure as the cross section of FIG. 1A. That is, the structure of FIG. 1A may be applied not only to the semiconductor device 100 of the planar type, as in FIG. 1B and FIG. 1C, but also to the semiconductor device 100 of the trench type.

Figure 2B:
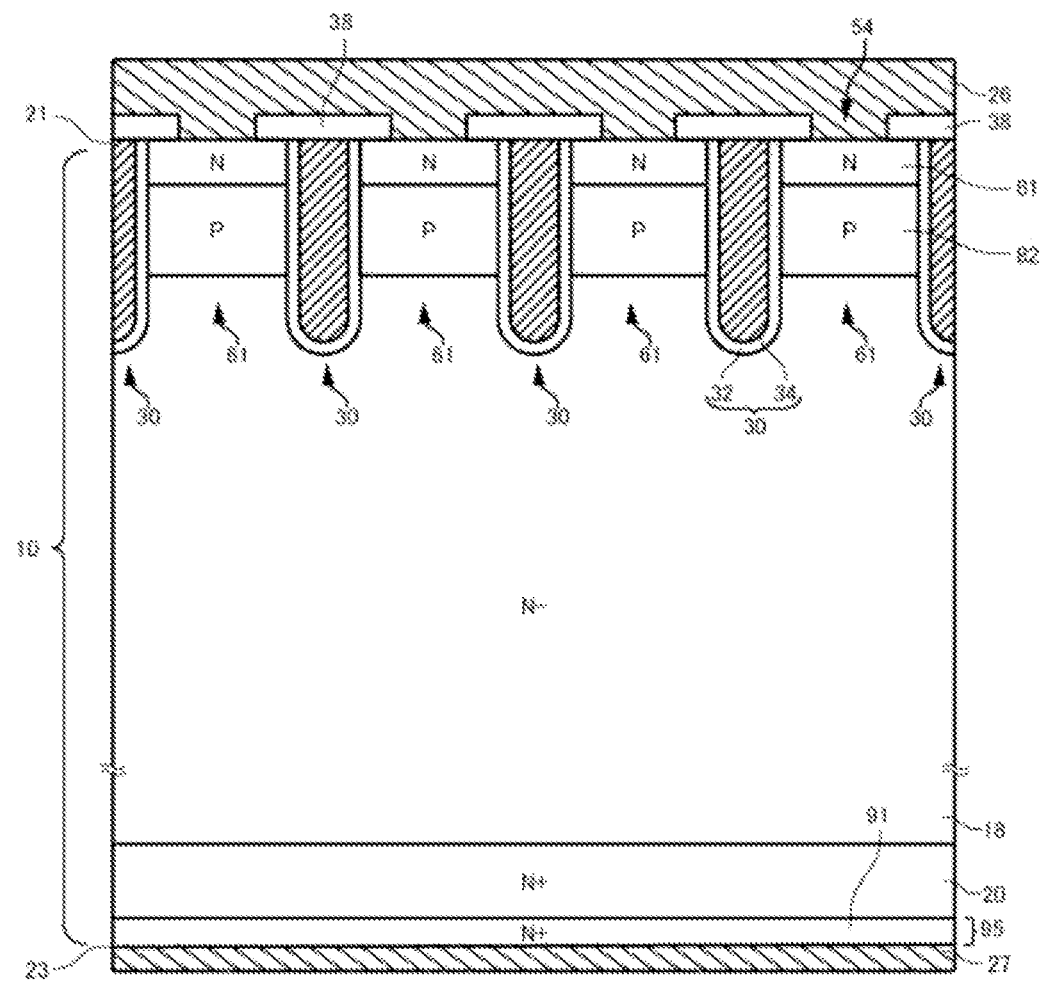
FIG. 2B shows an example of a cross-sectional view of the semiconductor device 100 according to Example 3.

FIG. 2B shows an example of a cross-sectional view of the semiconductor device 100 according to Example 3. FIG. 2B shows an example of a cross section C-C in FIG. 2A. The cross section C-C is a cross section of a region, on the front surface 21, where the first anode region 81 is provided. The second anode region 82 is provided below the first anode region 81.

The dummy trench portion 30 has a dummy trench, the dummy dielectric film 32, and the dummy conductive portion 34 which are provided on the front surface 21 of the semiconductor substrate 10. The dummy conductive portion 34 is electrically connected to the front surface side electrode 26. The dummy dielectric film 32 is provided to cover an inner wall of the dummy trench. The dummy conductive portion 34 is provided inside the dummy trench, and is provided on an inner side further than the dummy dielectric film 32. The dummy dielectric film 32 insulates the dummy conductive portion 34 from the semiconductor substrate 10.

An interlayer dielectric film 38 covers the dummy trench portion 30 on the front surface 21 of the semiconductor substrate 10. For example, the interlayer dielectric film 38 is an HTO film, a BPSG film, or a layered film of these. In the interlayer dielectric film 38, a contact hole 54 is provided to connect the front surface side electrode 26 to the front surface 21 of the semiconductor substrate 10.

In the mesa portion 61, the first anode region 81 is provided closer to the front surface 21 side than the second anode region 82 is. A thickness of the first anode region 81 in the depth direction of the semiconductor substrate 10 is thinner than the thickness of the second anode region 82. In the present example, the thickness of the first anode region 81 is half the thickness of the second anode region 82.

A buffer region 20 is provided below the drift region 18. The buffer region 20 is provided between the drift region 18 and the cathode layer 95. The conductivity type of the buffer region 20 is the N+ type. The buffer region 20 has a higher doping concentration than that of the drift region 18. The buffer region 20 has one or a plurality of doping concentration peaks of doping concentrations higher than that of the drift region 18. The plurality of doping concentration peaks are arranged at different positions in the depth direction of the semiconductor substrate 10. The doping concentration peak of the buffer region 20 may be, for example, a donor concentration peak of hydrogen or phosphorus. Alternatively, the buffer region 20 may be omitted.

Figure 2C:
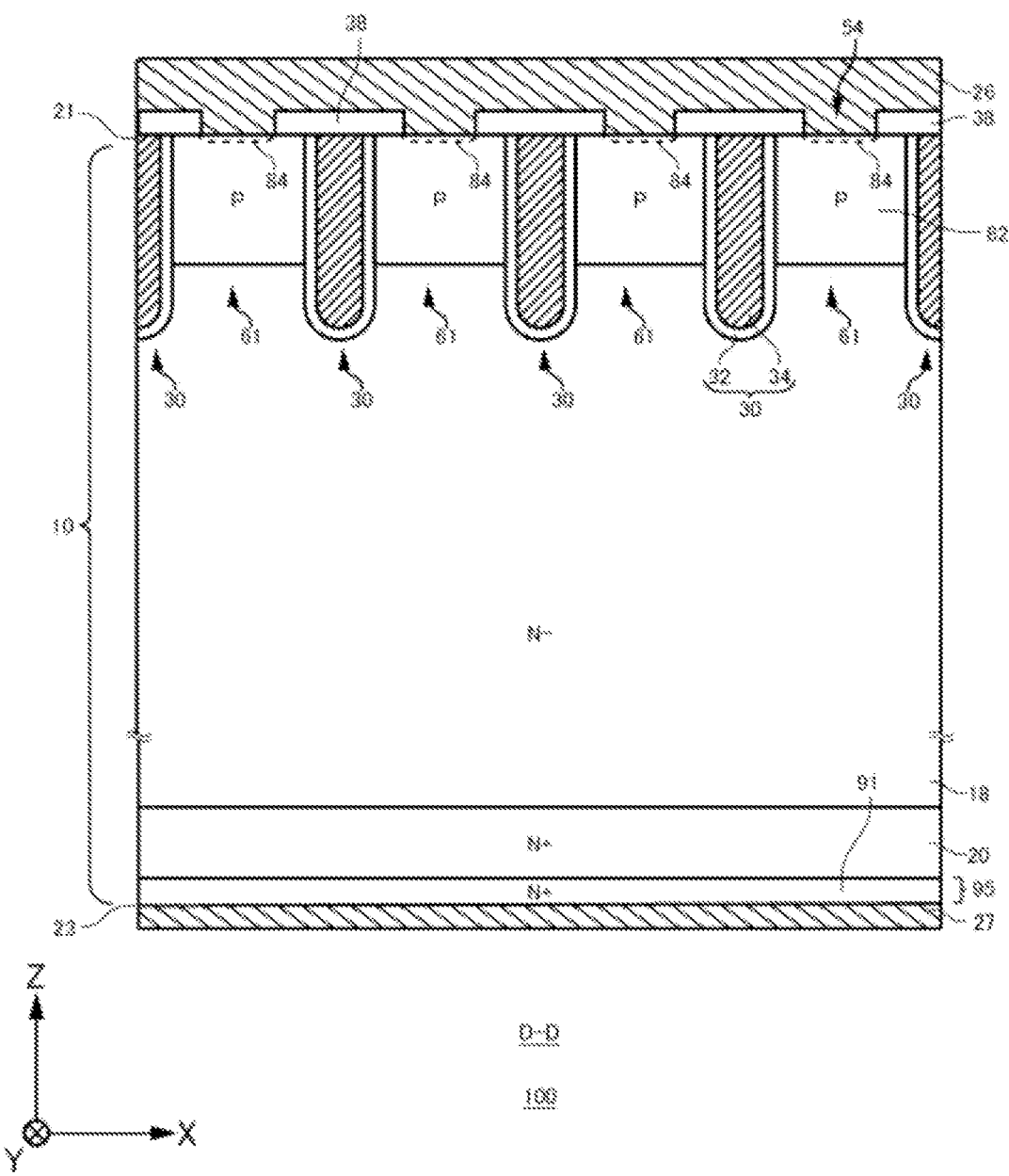
FIG. 2C shows an example of a cross-sectional view of the semiconductor device 100 according to Example 3.

FIG. 2C shows an example of a cross-sectional view of the semiconductor device 100 according to Example 3. FIG. 2C shows an example of a cross section D-D in FIG. 2A. The cross section D-D is a cross section of a region, on the front surface 21, where the second anode region 82 is provided. As shown by the dashed line, the contact region 84 may be included on the front surface 21 side of the second anode region 82. The contact region 84 may be formed on the front surface 21 where the contact hole 54 is formed in the top plan view. The second anode region 82 is in contact with the interlayer dielectric film 38 except an end portion of the interlayer dielectric film 38. The contact region 84 may enter the end portion of the interlayer dielectric film 38. Below the second anode region 82, the drift region 18 is provided. A depth of the second anode region 82 in the cross section D-D may be the same as a depth of the second anode region 82 in the cross section C-C in FIG. 2B.

Figure 2D:
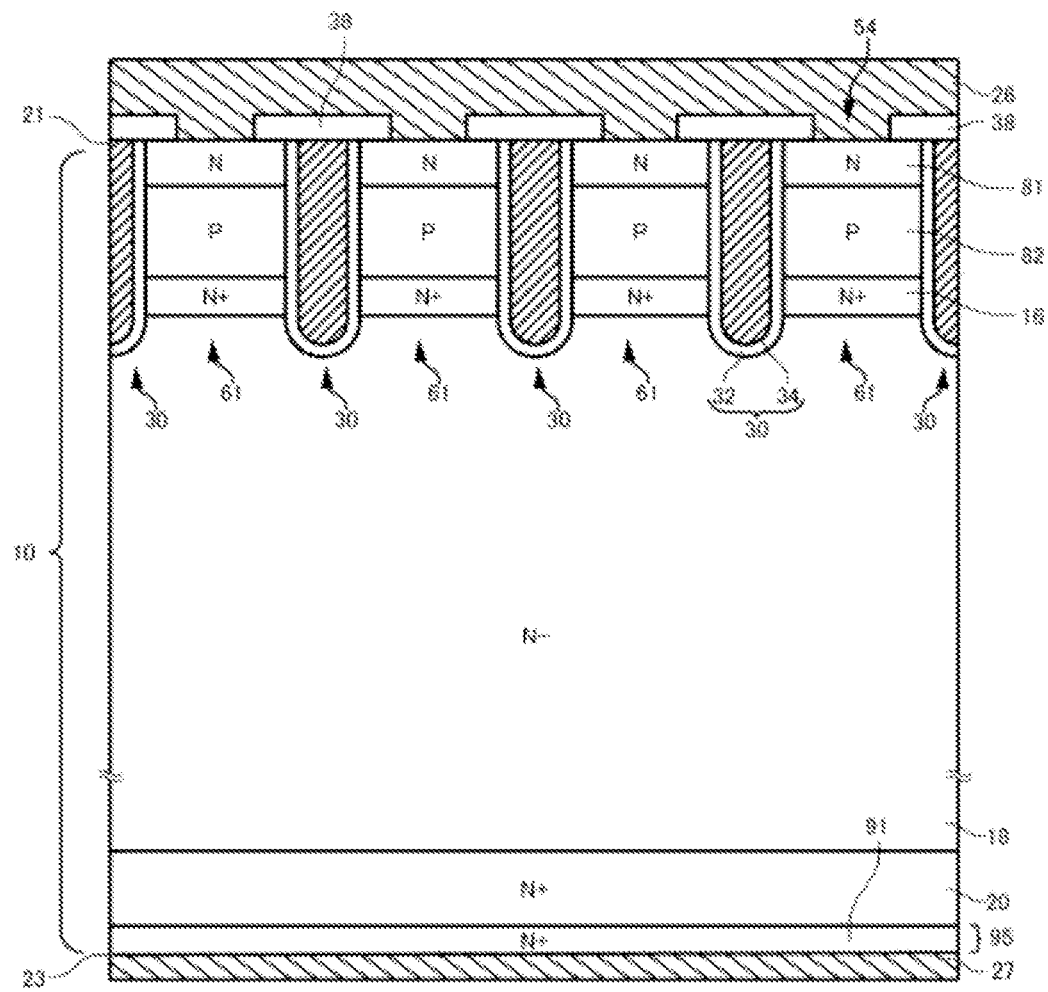
FIG. 2D shows an example of a cross-sectional view of the semiconductor device 100 according to Example 4.

FIG. 2D shows an example of a cross-sectional view of the semiconductor device 100 according to Example 4. The semiconductor device 100 of the present example is different from the semiconductor device 100 according to Example 3 in that the semiconductor device 100 includes an accumulation region 16. The top plan view may be common to FIG. 2A and FIG. 2D.

The accumulation region 16 is a region of a first conductivity type that has a higher doping concentration than that of the drift region 18. The accumulation region 16 is provided below the first anode region 81 and the second anode region 82. The accumulation region 16 of the present example is provided between the second anode region 82 and the drift region 18. The accumulation region 16 may be provided on an entire surface of the mesa portion 61. The accumulation region 16 may have a substantially uniform doping concentration over the mesa portion 61 in an array direction described below. Alternatively, in the accumulation region 16, the doping concentration may decrease or may increase toward the central portion in the array direction of the mesa portion 61. In the accumulation region 16 of the present example, the doping concentration is substantially uniform over the mesa portion 61.

Note that it is not limited whether the semiconductor device 100 includes the accumulation region 16 or not based on each Example. That is, even for other Example than the example where accumulation region 16 is included, the semiconductor device 100 may include the accumulation region 16 optionally. In each Example, the accumulation region 16 may be provided on the entire surface, and may be selectively provided.

Figure 3A:
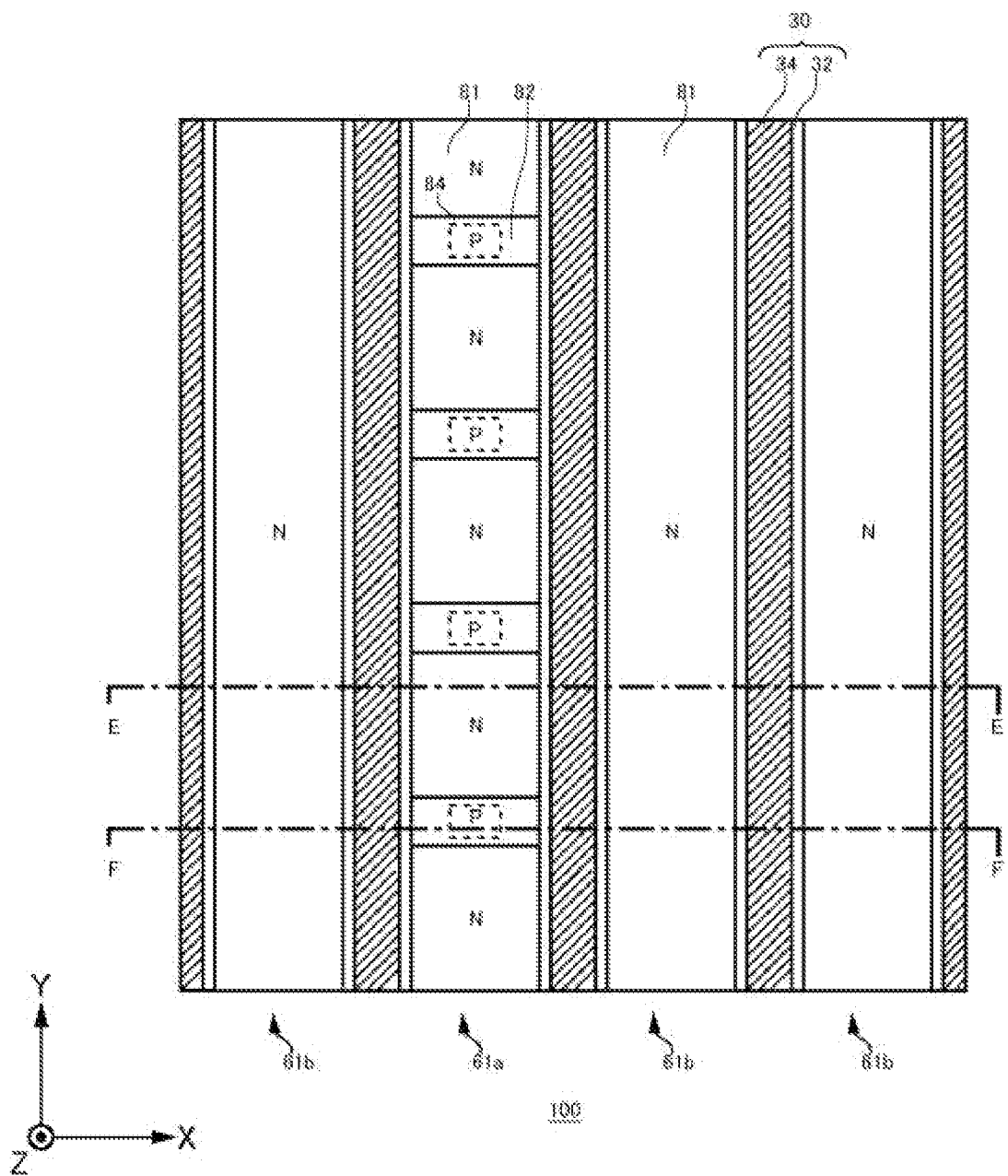
FIG. 3A shows an example of a top plan view of the semiconductor device 100 of the trench type.

FIG. 3A shows an example of a top plan view of the semiconductor device 100 of the trench type. On the front surface 21 in the semiconductor device 100 of the present example, the ratio between the first anode region 81 and the second anode region 82 is different from that of FIG. 2A. Note that in FIG. 3A, an illustration of the electrode and the interlayer dielectric film which are provided above the front surface 21 is omitted.

In any mesa portion of the plurality of mesa portions interposed between the plurality of dummy trench portions 30, an upper surface of the second anode region 82 is entirely covered with the first anode region 81. This makes it possible to further reduce the area ratio of the second anode region 82. For example, on the front surface 21, of any of the mesa portions interposed between the plurality of dummy trench portions 30, the area of the second anode region 82 may be equal to or smaller than 1% of the total area. Further, on the front surface 21, of any of the mesa portions interposed between the plurality of dummy trench portions 30, the area of the second anode region 82 may be equal to or smaller than 0.01% of the total area.

A mesa portion 61a is a mesa portion in which the first anode region 81 and the second anode region 82 are alternately provided on the front surface 21. In the mesa portion 61a, the first anode region 81 and the second anode region 82 may be arranged similarly to those of FIG. 2A. That is, on the front surface 21 of the mesa portion 61a, the area of the first anode region 81 may be greater than the area of the second anode region 82. In the present example, the ratio between the width of the first anode region 81 in the Y axis direction and the width of the second anode region 82 in the Y axis direction is 3:1.

In a portion of the mesa portion 61a where the second anode region 82 is exposed on the front surface 21, as shown by the dashed line, the contact region 84 may be included on the front surface 21 side of the second anode region 82.

A mesa portion 61b is a mesa portion in which the first anode region 81 is provided on the entire front surface 21. That is, in the mesa portion 61b, the upper surface of the second anode region 82 is completely covered with the first anode region 81.

The mesa portion 61b is provided more than the mesa portion 61a. In the present example, three mesa portions 61b are provided for one mesa portion 61a. A ratio between the mesa portion 61a and the mesa portion 61b may be 1:1, 1:2, or 1:3. The ratio between the first anode region 81 and the second anode region 82 for the entire semiconductor device 100 may be appropriately adjusted by the ratio between the mesa portion 61a and the mesa portion 61b, and the ratio between the first anode region 81 and the second anode region 82 in the mesa portion 61a.

Figure 3B:
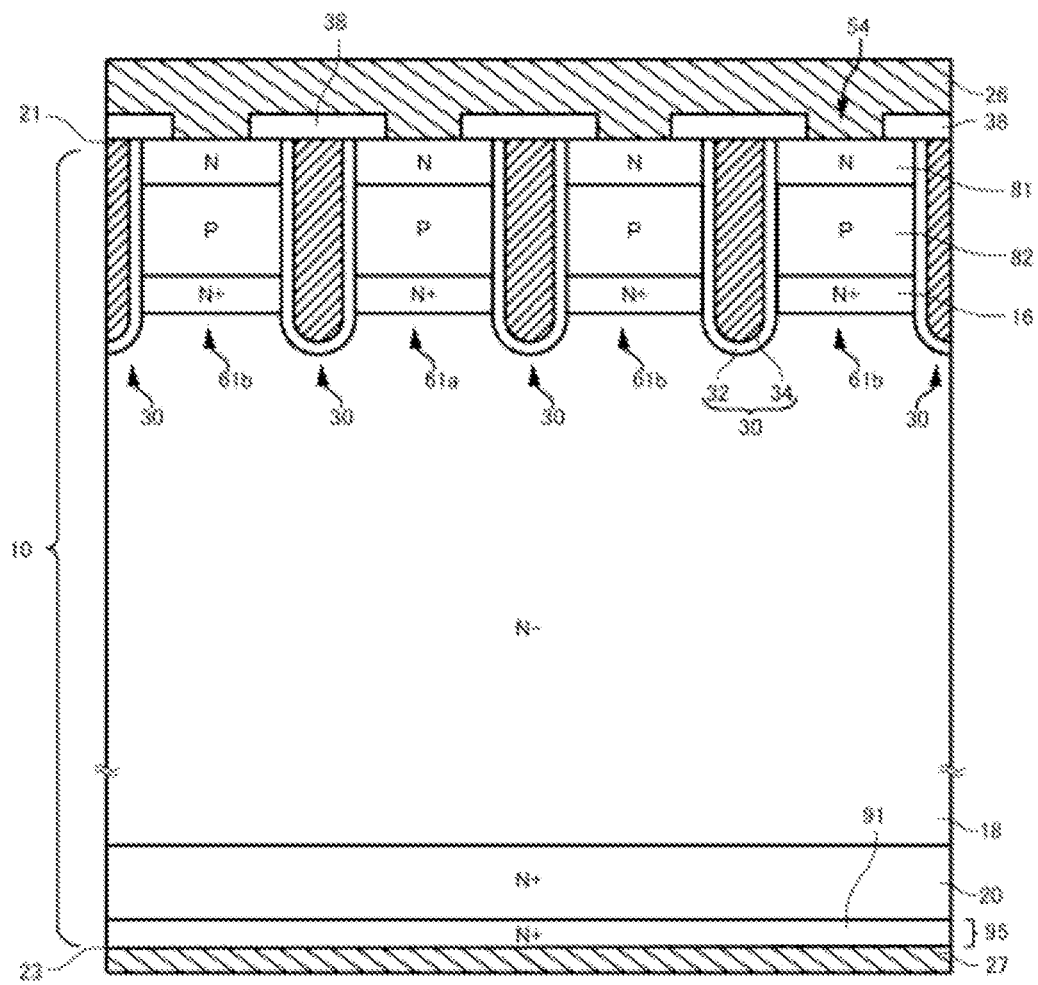
FIG. 3B shows an example of a cross-sectional view of the semiconductor device 100 according to Example 5.

FIG. 3B shows an example of a cross-sectional view of the semiconductor device 100 according to Example 5. FIG. 3B corresponds to a cross section E-E in FIG. 3A. The cross section E-E is a cross section of a region, on the front surface 21 of the mesa portion 61a, where the first anode region 81 is provided. In the mesa portion 61a of the cross section E-E, the second anode region 82 is provided below the first anode region 81.

Figure 3C:
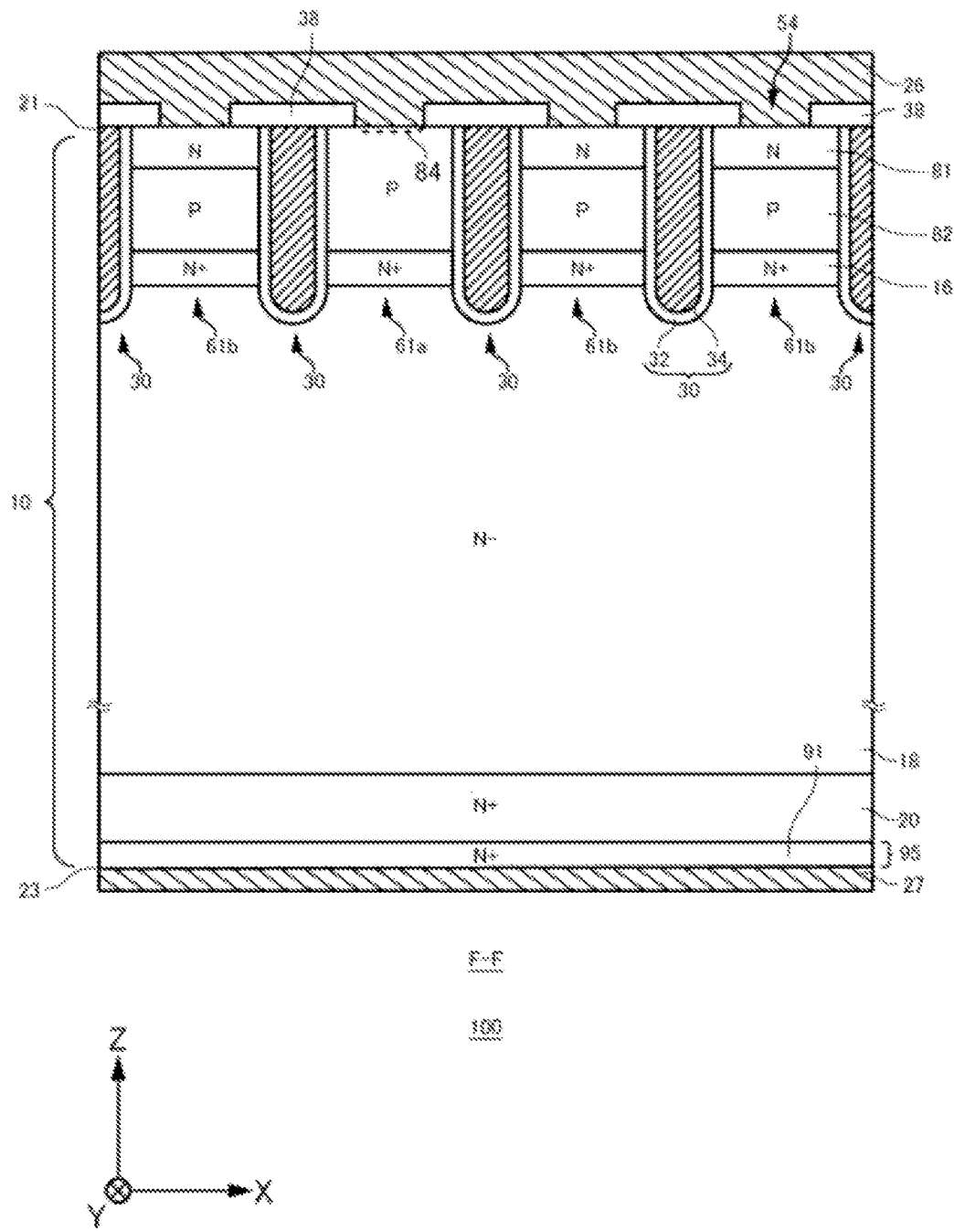
FIG. 3C shows an example of a cross-sectional view of the semiconductor device 100 according to Example 5.

FIG. 3C shows an example of a cross-sectional view of the semiconductor device 100 according to Example 5. FIG. 3C corresponds to a cross section F-F in FIG. 3A. The cross section F-F is a cross section of a region, on the front surface 21 of the mesa portion 61a, where the second anode region 82 is provided. In the cross section F-F, the first anode region 81 is not provided in the mesa portion 61a. As shown by the dashed line, the contact region 84 may be included on the front surface 21 side of the second anode region 82. The contact region 84 may be formed on the front surface 21 where the contact hole 54 is formed in the top plan view. The second anode region 82 is in contact with the interlayer dielectric film 38 except the end portion of the interlayer dielectric film 38. The contact region 84 may enter a region under the end portion of the interlayer dielectric film 38, the region is on the front surface 21 side of the second anode region 82.

Figure 4A:
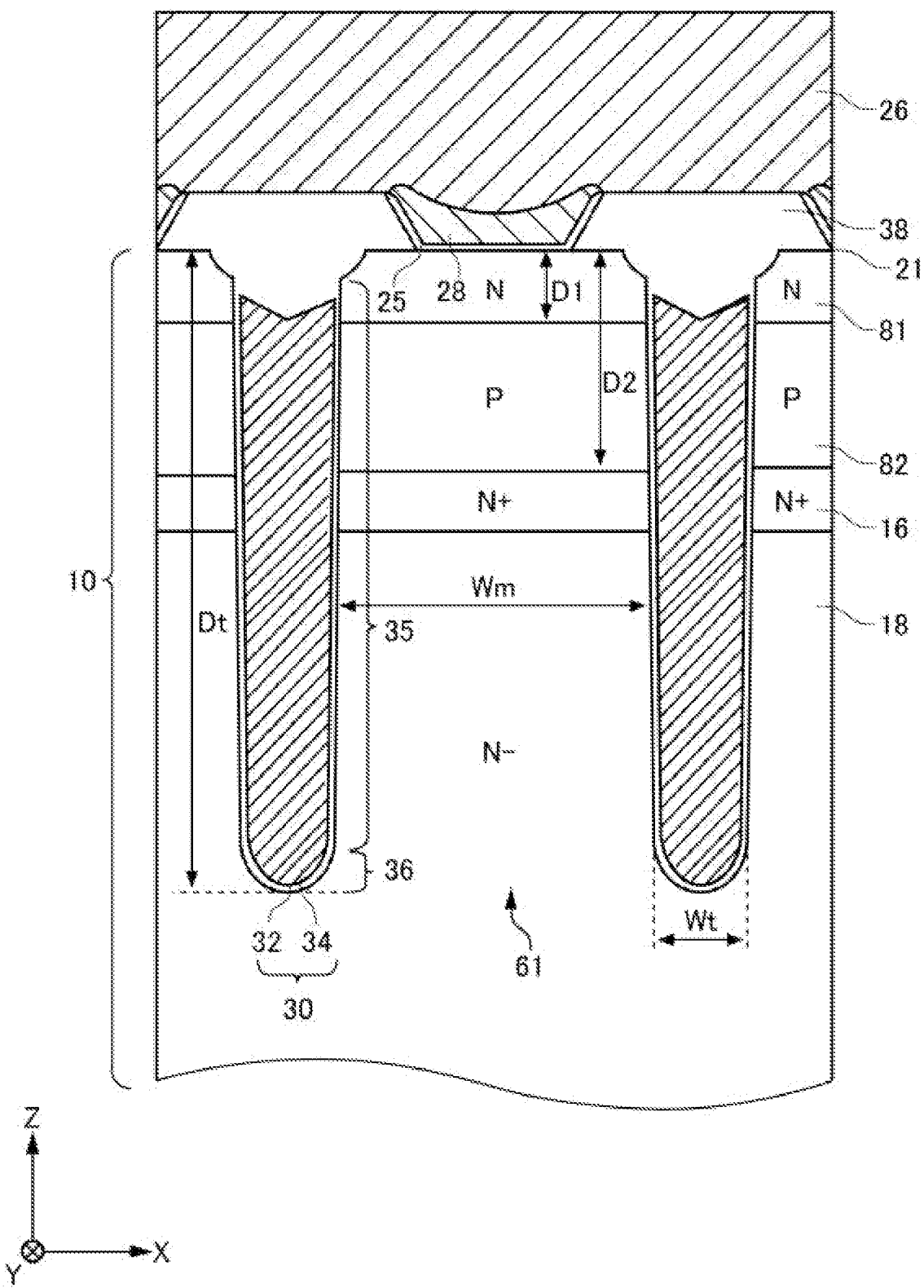
FIG. 4A is an example of an enlarged view showing a structure of the front surface 21 side of the semiconductor device 100.

FIG. 4A is an example of an enlarged view showing a structure of a front surface 21 side of the semiconductor device 100. In the present example, the mesa portion 61 between the dummy trench portions 30 is enlarged.

A depth D1 of a lower end of the first anode region 81 is shallower than half a depth D2 of a lower end of the second anode region 82. For example, when the depth D2 of the lower end of the second anode region 82 is 3 μm, the depth D1 of the lower end of the first anode region 81 is smaller than 1.5 μm.

A connection portion 28 connects the first anode region 81 and the front surface side electrode 26. The connection portion 28 includes a material that makes the Schottky contact with the first anode region 81. The connection portion 28 may include a barrier metal 25. For example, the material of the connection portion 28 is tungsten. The connection portion 28 is embedded in an opening such as a contact hole 54. The connection portion 28 is an example of a plug that is connected to the front surface side electrode 26.

In the connection portion 28, the barrier metal 25 is provided in contact with the front surface 21 of the semiconductor substrate 10. The barrier metal 25 may include at least one of Ti, V, Ni, Mo, W, Pd, Cr, and Pt. For example, the barrier metal 25 includes at least one of Ti, V, Ni, and Pt. Further, the barrier metal 25 may include a compound such as a titanium compound. The barrier metal 25 suppresses diffusion of aluminum atoms included in the front surface side electrode 26 into the semiconductor substrate 10. The Schottky barrier ϕB may be equal to or less than 0.9 eV, equal to or less than 0.7 eV, equal to or less than 0.5 eV, or equal to or less than 0.3 eV.

A trench depth Dt of the dummy trench portion 30 is deeper than the depth D2 of the lower end of the second anode region 82. For example, the trench depth Dt of the dummy trench portion 30 is from 5 μm to 7 μm. Further, the trench depth Dt of the dummy trench portion 30 may be equal to or greater than twice the depth D2 of the lower end of the second anode region 82.

A mesa width Wm is a width of the mesa portion 61 in the X axis direction. That is, the mesa width Wm indicates an interval between the adjacent dummy trench portions 30. For example, the mesa width Wm is 0.8 μm. The mesa width Wm is smaller than a trench width Wt of the dummy trench portion 30. For example, the trench width Wt is 1.0 μm. By making the mesa width Wm small, it further facilitates reducing the leak current by a pinch-off effect.

The dummy trench portion 30 has a sidewall region 35 and a bottom region 36. The sidewall region 35 is a region which faces the dummy conductive portion 34 with the dummy dielectric film 32 interposed therebetween, and is a region where the dummy trench portion 30 extends from the front surface 21 side to the rear surface 23 side. The bottom region 36 is a region where a width of the dummy trench portion 30 decreases from the side wall region 35 of the dummy trench portion 30 toward a deepest (that is, the closest to the rear surface 23) bottom portion of the dummy trench portion 30. Note that a size of the trench structure of the present example may be commonly used not only in the dummy trench portion 30 but also in a gate trench portion 40 which is described below.

Figure 4B:
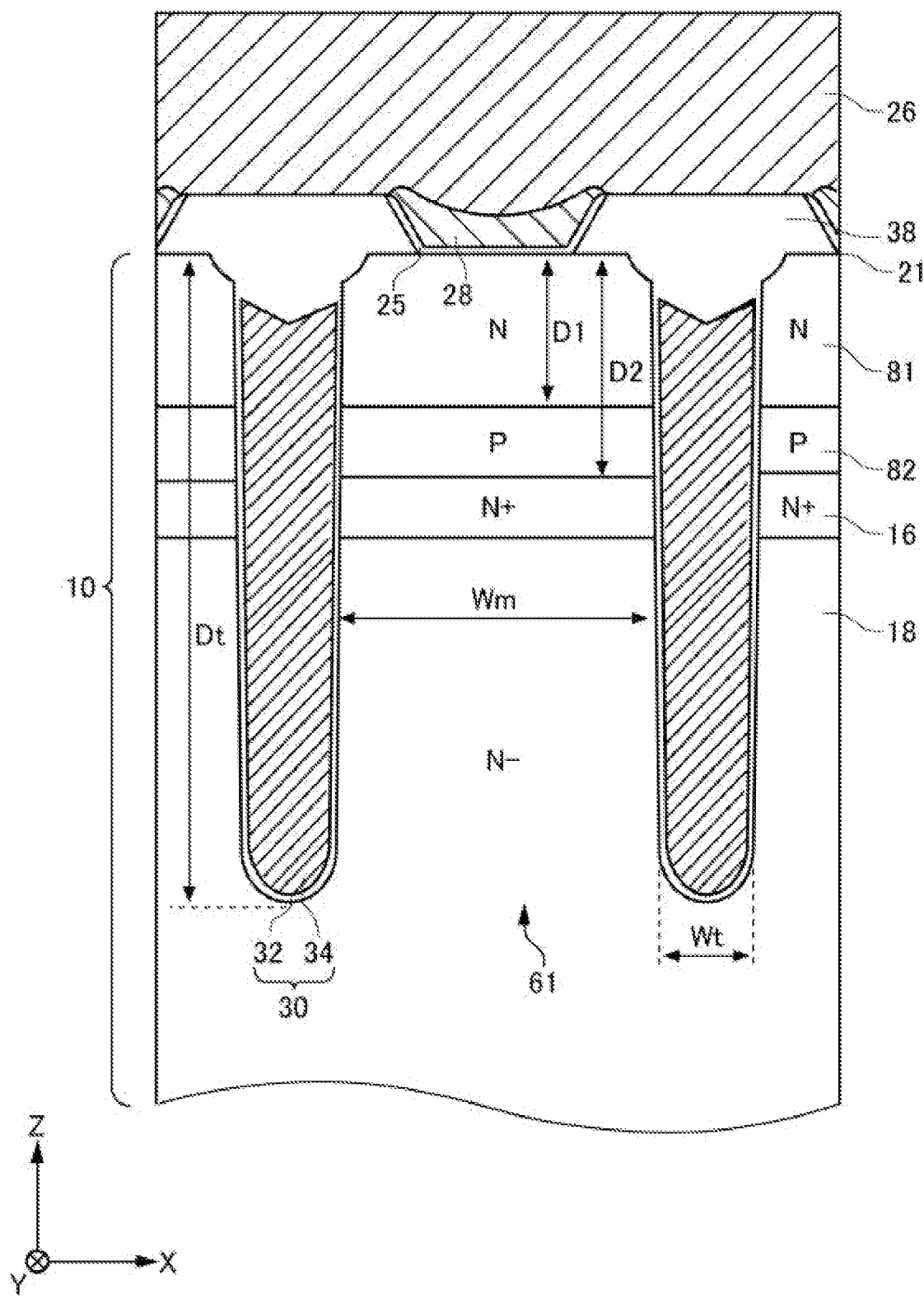
FIG. 4B is an example of an enlarged view showing a structure of the front surface 21 side of the semiconductor device 100.

FIG. 4B is an example of an enlarged view showing a structure of the front surface 21 side of the semiconductor device 100. In the present example, the depth D1 of the lower end of the first anode region 81 is different from that of FIG. 4A.

The depth D1 of the lower end of the first anode region 81 is deeper than half the depth D2 of the lower end of the second anode region 82 and is shallower than the depth D2 of the lower end of the second anode region 82. For example, when the depth of the second anode region 82 is 3 μm, the depth D1 of the lower end of the first anode region 81 is equal to or greater than 1.5 μm. Further, the thickness of the second anode region 82 in the depth direction may be equal to or greater than 0.5 μm.

Figure 4C:
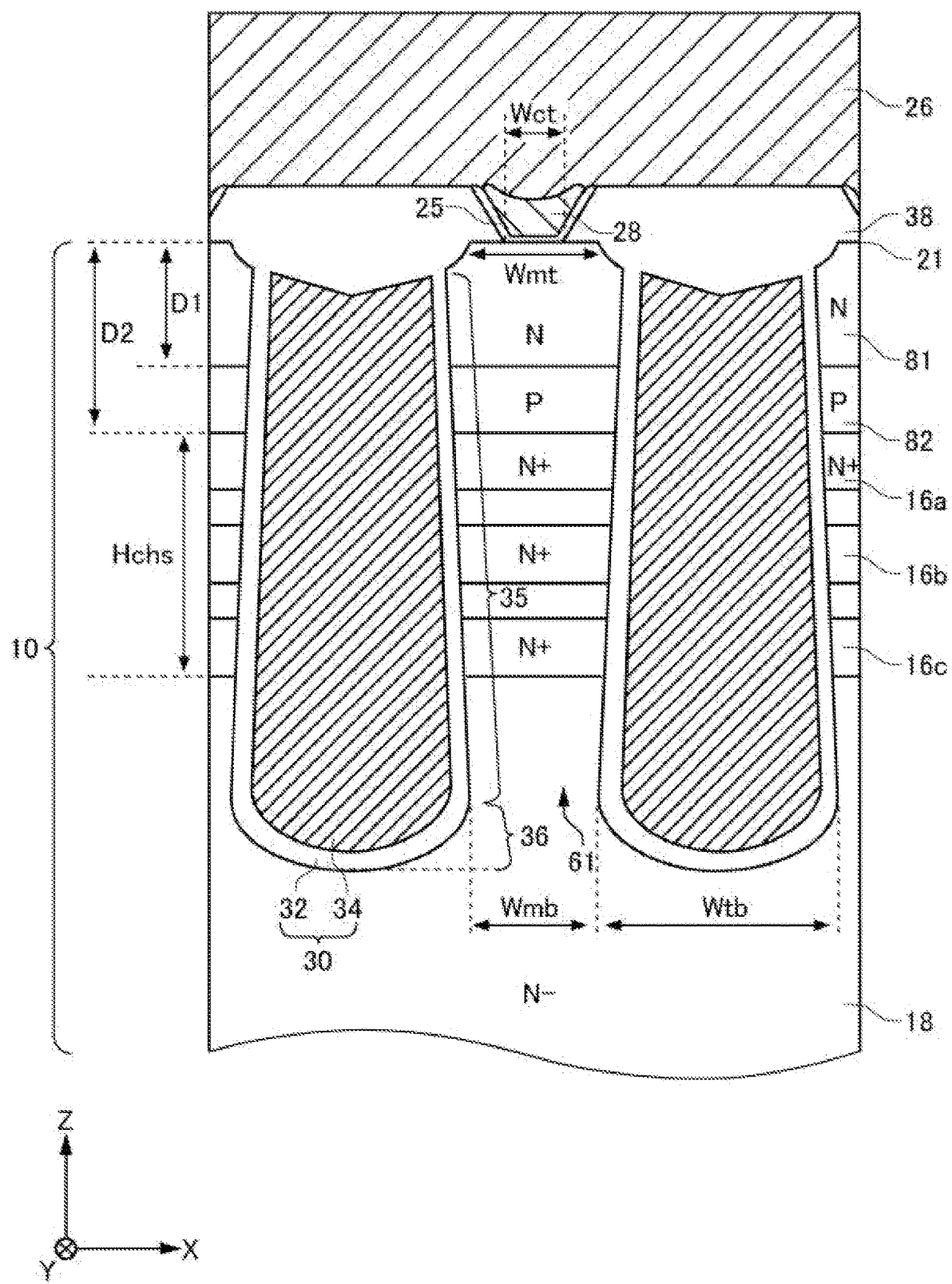
FIG. 4C is an example of an enlarged view showing a structure of the front surface 21 side of the semiconductor device 100.

FIG. 4C is an example of an enlarged view showing a structure of the front surface 21 side of the semiconductor device 100. The structure of the present example shows Modification Examples of the mesa portion 61 and the dummy trench portion 30. The semiconductor device 100 of the present example includes a plurality of accumulation region 16. The accumulation region 16 of the present example includes an accumulation region 16a, an accumulation region 16b, and an accumulation region 16c.

The accumulation region 16a is provided below the second anode region 82. The accumulation region 16a of the present example is provided in contact with the lower end of the second anode region 82. The accumulation region 16b is provided between the accumulation region 16a and the accumulation region 16c in the depth direction. The accumulation region 16c is provided below the accumulation region 16b. The drift region 18 may be provided between the accumulation region 16a and the accumulation region 16b, and between the accumulation region 16b and the accumulation region 16c. The doping concentrations of the accumulation region 16a, the accumulation region 16b, and the accumulation region 16c may be the same or different.

When a plurality of accumulation regions 16 are provided, a width Hchs of the accumulation region 16 in the depth direction indicates a thickness from an upper end to a lower end of the plurality of accumulation regions 16. The width Hchs of the present example indicates the thickness from the upper end of the accumulation region 16a to the lower end of the accumulation region 16c. In the present example, the accumulation region 16a, the accumulation region 16b, and the accumulation region 16c have the same thickness in the depth direction. Note that the thicknesses of the accumulation region 16a, the accumulation region 16b, and the accumulation region 16c in the depth direction may be different from one another.

The plurality of accumulation regions 16 may have a plurality of peaks of doping concentration distribution. Between the plurality of peaks, a valley of the doping concentration distribution may be included. A doping concentration of the valley of the doping concentration distribution may be higher than that of the drift region 18. Alternatively, the plurality of accumulation regions 16 may have kink-shaped doping concentration distribution. The plurality of accumulation regions 16 may be formed by ion implantation of an impurity (for example, phosphorus, hydrogen, or the like), which serves as a donor, being performed multiple times at different acceleration energies.

A lower end of a deepest accumulation region (the accumulation region 16c in the present example) of the plurality of accumulation regions 16 may be deeper than half a depth position of the dummy trench portion 30. Further, the lower end of the deepest accumulation region of the plurality of accumulation regions 16 may have a depth which is the same as or shallower than a depth of a boundary between the sidewall region 35 and the bottom region 36.

An upper mesa width Wmt is a width of the mesa portion 61 on the front surface 21 of the semiconductor substrate 10. The upper mesa width Wmt is a width of an upper end of the first anode region 81 in the mesa portion 61. The region where the first anode region 81 is provided on the front surface 21 may have the same upper mesa width Wmt as the region where the second anode region 82 is provided on the front surface 21.

An upper contact width Wct is a width of a contact hole, which is formed on the front surface 21 of the semiconductor substrate 10, on the front surface 21. The width of the contact hole is a width along the array direction in which the plurality of dummy trench portions 30 or gate trench portions 40 are arrayed. Note that the array direction is parallel to the front surface 21 in a plan view, and may be a direction perpendicular to the extension direction (or a longitudinal direction) in which the dummy trench portion 30 or the gate trench portion 40 is formed to elongate and extend.

A lower mesa width Wmb is a mesa width for a lower portion of the dummy trench portion 30. The lower mesa width Wmb of the present example may be a mesa width at a position where a width of the mesa portion 61 is narrowest.

A lower trench width Wtb is a width of the dummy trench portion 30 at the same depth as the lower mesa width Wmb. In other words, the lower trench width Wtb is a maximum trench width of the dummy trench portion 30.

The upper mesa width Wmt may be greater than the lower mesa width Wmb. That is, the mesa portion 61 of the present example has a mesa width which gradually narrows from the front surface 21 toward the rear surface 23. Therefore, the dummy trench portion 30 of the present example has a structure in which the trench width gradually increases from the front surface 21 toward the rear surface 23. The gate trench portion 40 may also have the same structure as the dummy trench portion 30 of the present example.

The upper mesa width Wmt may be smaller than the lower trench width Wtb. By increasing the lower trench width Wtb and narrowing the mesa width at the upper end of the mesa portion 61, it is possible to further suppress the hole injection from the front surface side electrode 26.

The lower mesa width Wmb may be smaller than the upper contact width Wct. This makes it possible to further suppress the hole injection from the front surface side electrode 26. By suppressing the hole injection in a diode portion 80, it is possible to reduce a reverse recovery current or a reverse recovery charge, and it is possible to improve reverse recovery characteristics.

The depth D1 of the lower end of the first anode region 81 is deeper than half the depth D2 of the lower end of the second anode region 82. In other words, the depth D1 of the lower end of the first anode region 81 may be greater than a difference between the depth D1 of the lower end of the first anode region 81 and the depth D2 of the lower end of the second anode region 82. For example, when the depth D2 of the lower end of the second anode region 82 is 3 µm, the depth D1 of the lower end of the first anode region 81 is greater than 1.5 µm. The depth D2 of the lower end of the second anode region 82 may be smaller than the width Hchs in the depth direction. This makes it possible to further suppress the hole injection.

In the semiconductor device 100 of the present example, by gradually reducing the mesa width of the mesa portion 61 from the front surface 21 toward the rear surface 23, punch-through of the depletion layer to the first anode region 81 can be prevented even when the depth D1 of the lower end of the first anode region 81 is deep.

Note that the semiconductor device 100 may include the plurality of accumulation regions 16 even in an Example in which the width of the mesa portion 61 does not narrow toward the rear surface as in FIG. 4A or FIG. 4B.

Figure 4D:
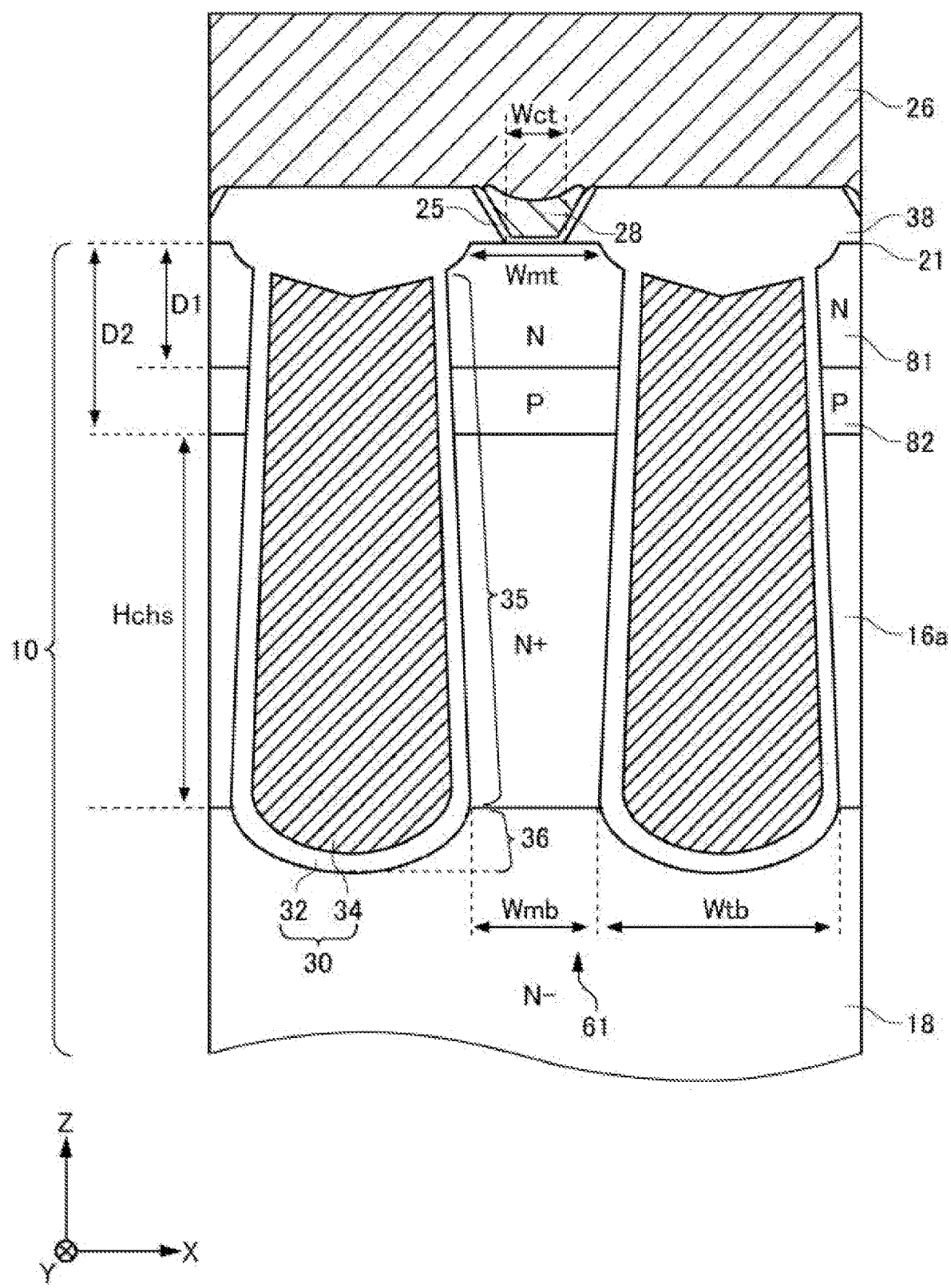
FIG. 4D is an example of an enlarged view showing a structure of the front surface 21 side of the semiconductor device 100.

FIG. 4D is an example of an enlarged view showing a structure of the front surface 21 side of the semiconductor device 100. The structure of the present example shows Modification Examples of the mesa portion 61 and the dummy trench portion 30. The semiconductor device 100 of the present example is different from the semiconductor device 100 in FIG. 4C in that the semiconductor device 100 includes a single accumulation region, which is the accumulation region 16a. In the depth direction, the accumulation region 16a of the present example has a thickness thicker than that of the accumulation region 16a in FIG. 4C. Otherwise, the semiconductor device 100 of the present example may be the same as the semiconductor device 100 in FIG. 4C.

The accumulation region 16a is provided below the second anode region 82. The accumulation region 16a of the present example is provided in contact with the lower end of the second anode region 82. The thickness Hchs of the accumulation region 16a in the depth direction may be greater than the depth D2 of the lower end of the second anode region 82. The lower end of the accumulation region 16a may be located at a bottom portion where the width of the dummy trench portion 30 narrows from the sidewall region 35 toward the rear surface 23. The accumulation region 16a may have doping concentration distribution which is substantially uniform over the mesa portion 61 in the array direction, and may have doping concentration distribution in which the doping concentration decreases toward the center of the mesa portion 61. In the doping concentration distribution of the accumulation region 16a of the present example, the doping concentration decreases toward the center of the mesa portion 61.

The accumulation region 16a may have substantially uniform doping concentration distribution over the mesa portion 61 in the depth direction, and may have concentration distribution in which the doping concentration increases toward the rear surface 23. The accumulation region 16a of the present example has concentration distribution in which the doping concentration increases toward the rear surface 23 over the mesa portion 61 in the depth direction.

The lower end of the accumulation region 16a may be deeper than half the depth position of the dummy trench portion 30. Further, the lower end of the accumulation region 16a may have a depth which is the same as or shallower than the depth of the boundary between the sidewall region 35 and the bottom region 36. The depth of the lower end of the accumulation region 16a in the present example is the same as the boundary between the sidewall region 35 and the bottom region 36.

The lower mesa width Wmb may be a width at which the mesa portion 61 is completely depleted in a thermal equilibrium state. Alternatively, an integrated value obtained by integrating the doping concentration in the depth direction of the accumulation region 16a may be an integrated value at which the mesa portion 61 is completely depleted in the thermal equilibrium state. This makes it possible to suppress a decrease of a withstand voltage of the semiconductor device 100.

The accumulation region 16a of the present example may be formed by ion implantation of a dopant (for example, phosphorus, hydrogen, or the like), which serves as a donor, being performed multiple times at a predetermined acceleration energy such that peak concentrations of the dopant are different. The accumulation region 16a may also be formed by ion implantation of the dopant, which serves as a donor, being performed one time on the side wall of the dummy trench portion 30.

Figure 5A:
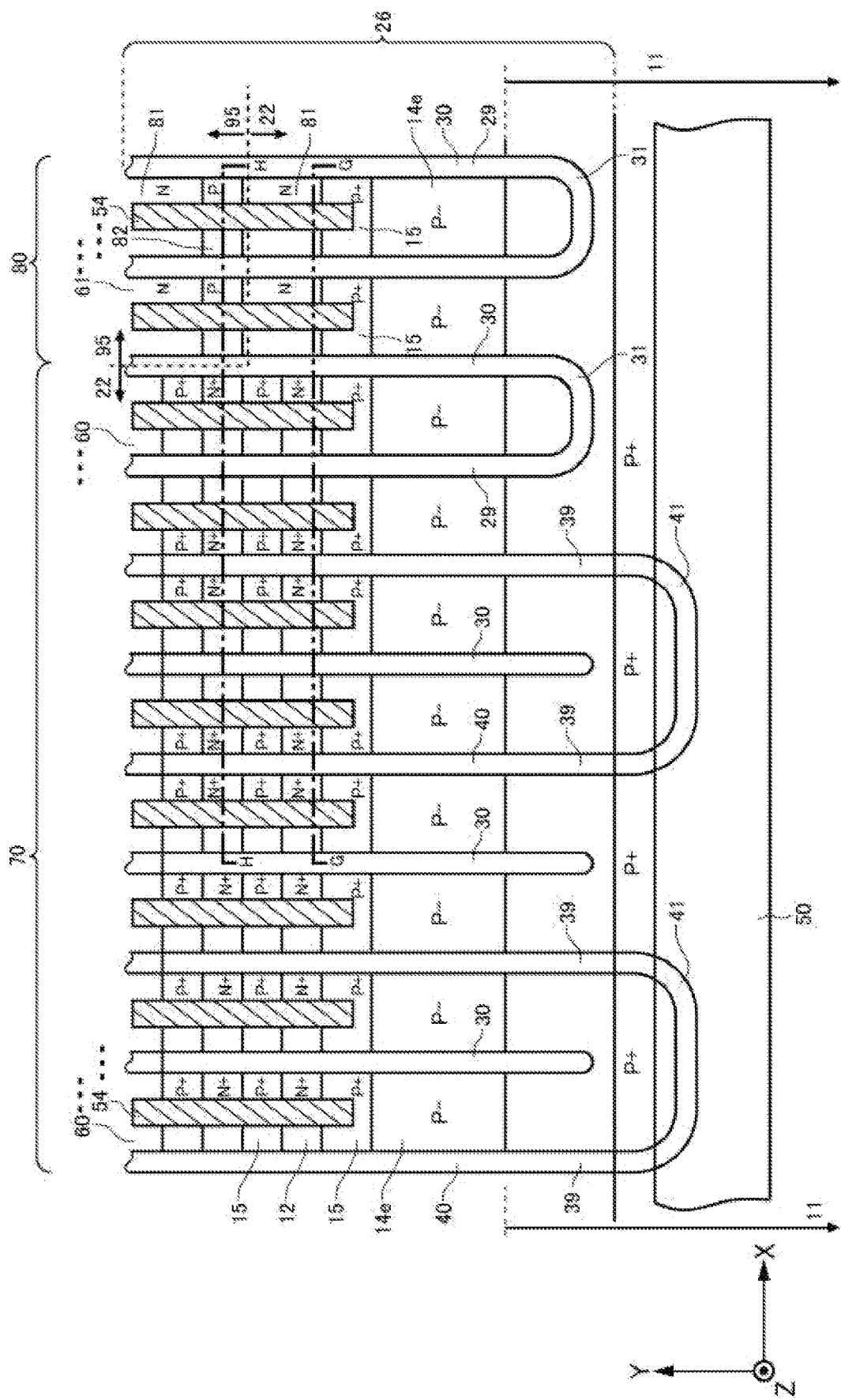
FIG. 5A shows an example of a top plan view of the semiconductor device 100 of the trench type.

FIG. 5A shows an example of a top plan view of the semiconductor device 100 of the trench type. The semiconductor device 100 of the present example is a semiconductor chip that includes a transistor portion 70 and a diode portion 80. For example, the semiconductor device 100 is a reverse conducting IGBT (RC-IGBT: Reverse Conducting IGBT).

The transistor portion 70 is a region where a collector region 22 provided on the rear surface 23 side of the semiconductor substrate 10 is projected onto the front surface 21 of the semiconductor substrate 10. The collector region 22 has the second conductivity type. The collector region 22 of the present example is of the P+ type, for example. The transistor portion 70 includes a transistor such as the IGBT.

The diode portion 80 may be a region where the cathode layer 95 is projected onto the front surface 21 of the semiconductor substrate 10. The diode portion 80 includes a diode such as a freewheeling diode (FWD: Free Wheel Diode) which is provided adjacent to the transistor portion 70 on the front surface 21 of the semiconductor substrate 10.

Note that in FIG. 5A, regions on an edge side of the transistor portion 70 and the diode portion 80 are shown, and an illustration for other regions is omitted. For example, the semiconductor device 100 of the present example may be provided with an edge termination structure portion. The edge termination structure portion relaxes an electric field concentration on the front surface 21 side of the semiconductor substrate 10. The edge termination structure portion has, for example, a structure of a guard ring, a field plate, a RESURF, or combinations of these.

On the front surface 21, the semiconductor device 100 includes the gate trench portion 40, the dummy trench portion 30, a well region 11, an emitter region 12, a base region 14, a contact region 15, the first anode region 81, and the second anode region 82. Each of the gate trench portion 40 and the dummy trench portion 30 is an example of the trench portion.

The front surface side electrode 26 and a gate metal layer 50 are provided above the front surface 21. The front surface side electrode 26 and the gate metal layer 50 are provided in isolation from each other. Between the front surface side electrode 26 and the gate metal layer 50, and the front surface 21, the interlayer dielectric film is provided, but the illustration is omitted in FIG. 5A. In the interlayer dielectric film of the present example, the contact hole 54 is provided to pass through the interlayer dielectric film. In FIG. 5A, each contact hole 54 is hatched with diagonal lines.

The front surface side electrode 26 is provided above the gate trench portion 40, the dummy trench portion 30, the well region 11, the emitter region 12, the base region 14, the contact region 15, the first anode region 81, and the second anode region 82. Through the contact hole 54, the front surface side electrode 26 is in contact with the emitter region 12, the contact region 15, the base region 14, the first anode region 81, and the second anode region 82 on the upper surface of the semiconductor substrate 10. Further, the front surface side electrode 26 is connected to the dummy conductive portion in the dummy trench portion 30 through the contact hole provided in the interlayer dielectric film. The front surface side electrode 26 may be connected to the dummy conductive portion of the dummy trench portion 30 at an edge of the dummy trench portion 30 in the Y axis direction.

The gate metal layer 50 is formed of a material including a metal. For example, at least a portion of a region of the gate metal layer 50 may be formed of aluminum, an aluminum-silicon alloy, or an aluminum-silicon-copper alloy. The gate metal layer 50 may have a barrier metal formed of titanium, a titanium compound, or the like below a region formed of aluminum or the like. The gate metal layer 50 is connected to the gate trench portion 40 through the contact hole provided in the interlayer dielectric film. The gate metal layer 50 may be connected to a gate conductive portion of the gate trench portion 40 at an edge portion 41 of the gate trench portion 40 in the Y axis direction. The gate metal layer 50 is not connected to the dummy conductive portion in the dummy trench portion 30.

A well region 11 is provided to overlap the gate metal layer 50. The well region 11 is provided to extend with a predetermined width up to a range not overlapping the gate metal layer 50. The well region 11 of the present example is provided away from an end of the contact hole 54 in the Y axis direction to a gate metal layer 50 side. The well region 11 is a region of a second conductivity type that has a higher doping concentration than that of the base region 14. For example, the base region 14 is of the P− type, and the well region 11 is of the P+ type.

Each of the transistor portion 70 and the diode portion 80 has a plurality of trench portions which are arrayed in an array direction. The transistor portion 70 of the present example is alternately provided with one or more gate trench portions 40 and one or more dummy trench portions 30 along the array direction. The diode portion 80 of the present example is provided with the plurality of dummy trench portions 30 along the array direction. The diode portion 80 of the present example is not provided with the gate trench portion 40. The array direction in the present example is the X axis direction.

The gate trench portion 40 may have two linear portions 39 extending along the extension direction perpendicular to the array direction (parts of a trench that are linear along the extension direction), and the edge portion 41 connecting the two linear portions 39. The extension direction in the present example is the Y axis direction.

Preferably, at least part of the edge portion 41 is provided in a curved shape in the top plan view. By the edge portion 41 connecting between end portions of the two linear portions 39 in the Y axis direction, it is possible to relax the electric field concentration at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extension direction, and may have linear portions 29 and an edge portion 31 as with the gate trench portion 40. The semiconductor device 100 of the present example includes both of the linear dummy trench portion 30 having no edge portion 31, and the dummy trench portion 30 having the edge portion 31.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in the top plan view. That is, at the end portion of each trench portion in the Y axis direction, a bottom portion of each trench portion in the depth direction is covered with the well region 11. This makes it possible to relax the electric field concentration at the bottom portion of each trench portion.

A mesa portion 60 is provided in the transistor portion 70. The mesa portion 61 is provided in the diode portion 80. The mesa portion 60 and the mesa portion 61 are provided between the respective trench portions in the array direction. On the front surface 21 of the semiconductor substrate 10, the mesa portion 60 and the mesa portion 61 are provided to extend in the extension direction (that is, the Y axis direction) along the trenches.

Each mesa portion is provided with the base region 14 or the second anode region 82. In the mesa portion, a region arranged closest to the gate metal layer 50, in the base region 14 exposed on the upper surface of the semiconductor substrate 10, is referred to as a base region 14e. While FIG. 5A shows the base region 14e arranged at one end portion of each mesa portion in the extension direction, the base region 14e is also arranged at the other end portion of each mesa portion.

The emitter region 12 is a region of a first conductivity type that is provided on the front surface 21 of the semiconductor substrate 10. The emitter region 12 in the present example is of the N+ type. The emitter region 12 is exposed on the upper surface of the semiconductor substrate 10 to be electrically connected to the front surface side electrode 26. The emitter region 12 is provided in the mesa portion 60. The emitter region 12 is provided in contact with the gate trench portion 40.

The contact region 15 is a region of a second conductivity type that is provided on the front surface 21 of the semiconductor substrate 10. The contact region 15 in the present example is of the P+ type. The contact region 15 is exposed on the upper surface of the semiconductor substrate 10 to be electrically connected to the front surface side electrode 26. The contact region 15 is provided in the mesa portion 60. The emitter region 12 and the contact region 15 may be provided between the base region 14 and the front surface 21 in the depth direction. The contact region 15 may be provided in the mesa portion 60 that is in contact with the gate trench portion 40.

Each of the emitter region 12 and the contact region 15 in the mesa portion 60 is provided from one trench portion up to the other trench portion in the X axis direction. As an example, the emitter region 12 and the contact region 15 in the mesa portion 60 are alternately arranged along the extension direction of the trench portion (that is, the Y axis direction).

In another example, the emitter region 12 and the contact region 15 in the mesa portion 60 may be provided in a stripe pattern along the extension direction of the trench portion (that is, the Y axis direction). For example, the emitter region 12 is provided in a region in contact with the trench portion, and the contact region 15 is provided in a region interposed between the emitter regions 12.

The mesa portion 61 is provided with the first anode region 81 and the second anode region 82. The mesa portion 61 is not provided with the emitter region 12. The mesa portion 61 may be provided with the first anode region 81 and the second anode region 82 in an arrangement shown in another Example. That is, on the front surface 21, the mesa portion 61 may have a repeated structure of the first anode region 81 and the second anode region 82, and may have only the first anode region 81.

Above the mesa portion 60 and the mesa portion 61, the contact hole 54 is provided. The contact hole 54 is arranged in a region interposed between the base regions 14e. The contact hole 54 of the present example is provided above each of the emitter region 12, the base region 14, the contact region 15, the first anode region 81, and the second anode region 82. The contact hole 54 is not provided in regions corresponding to the base region 14e and the well region 11. The contact hole 54 may be arranged at the center of the mesa portion in the array direction (that is, the X axis direction).

In the diode portion 80, the cathode layer 95 is provided in a region in direct contact with the rear surface 23 of the semiconductor substrate 10. In FIG. 5A, a boundary between the cathode layer 95 and the collector region 22 is indicated by a dashed line.

The cathode layer 95 is arranged away from the well region 11 in the Y axis direction. In this way, it is possible to improve a withstand voltage by ensuring a distance between the cathode layer 95 and a region (the well region 11) of a P type that has a relatively high doping concentration and that is formed up to a deep position. In the present example, an end portion of the cathode layer 95 in the Y axis direction is arranged away from the well region 11 further than an end portion of the contact hole 54 in the Y axis direction. In another example, the end portion of the cathode layer 95 in the Y axis direction may be arranged between the well region 11 and the contact hole 54.

Figure 5B:
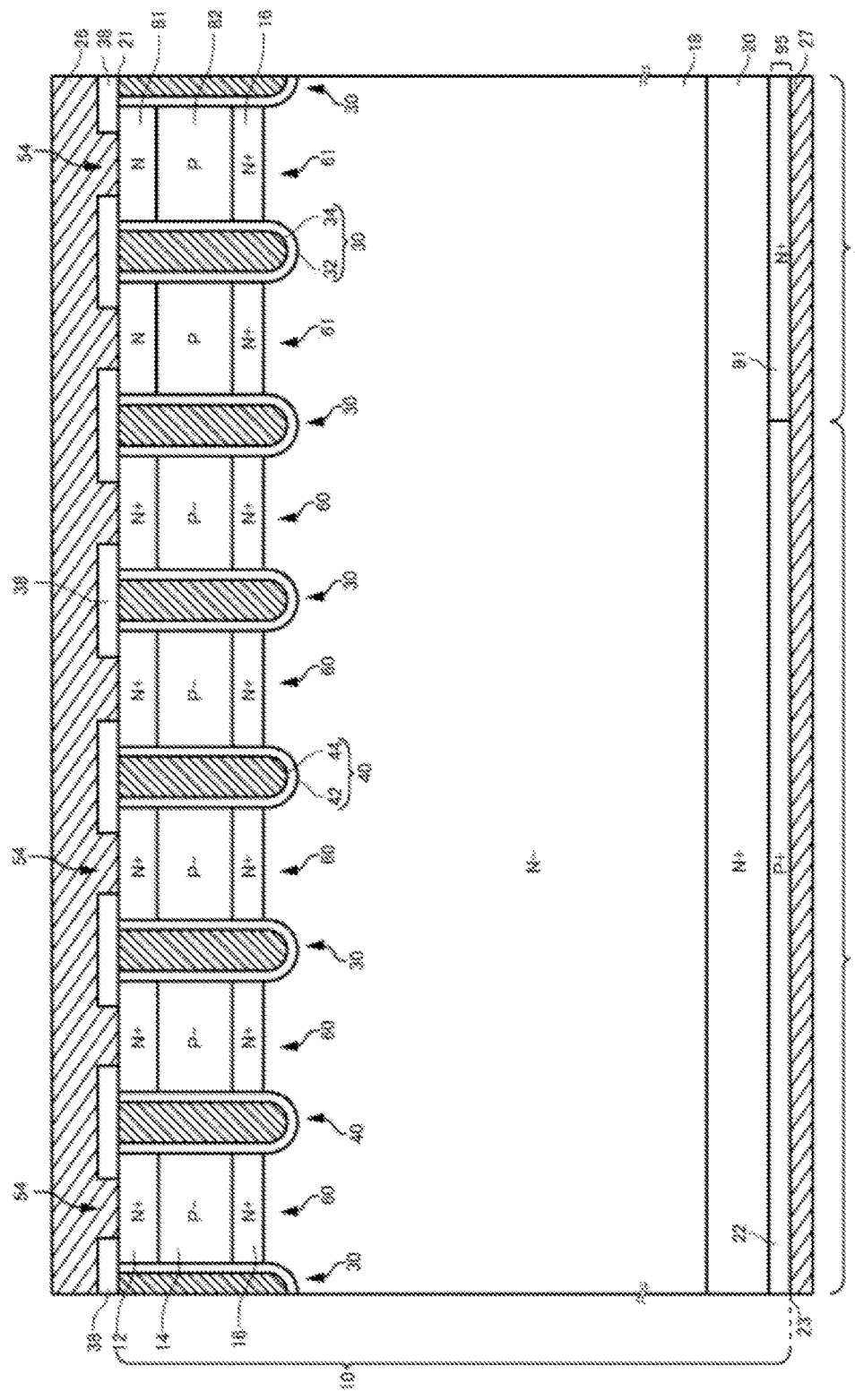
FIG. 5B shows an example of a cross-sectional view of the semiconductor device 100 according to Example 6.
Figure 5B:
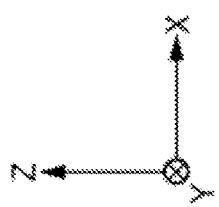

FIG. 5B shows an example of a cross-sectional view of the semiconductor device 100 according to Example 6. FIG. 5B shows an example of a cross section G-G in FIG. 5A. The cross section G-G is a cross section including the first anode region 81 in the front surface 21 of the diode portion 80.

The accumulation region 16 is provided below the base region 14. The accumulation region 16 is a region of an N+ type that has a higher doping concentration than that of the drift region 18. By providing the accumulation region 16 having the high concentration between the drift region 18 and the base region 14, it is possible to improve a carrier injection enhancement effect (IE effect) and to reduce an ON voltage. The accumulation region 16 may be provided to entirely cover a lower surface of the base region 14 in each mesa portion 60.

Further, the accumulation region 16 is also provided below the second anode region 82. The accumulation region 16 may be provided to entirely cover a lower surface of the second anode region 82 in each mesa portion 61. The accumulation regions 16 in the transistor portion 70 and the diode portion 80 may be provided in the same process.

The semiconductor device 100 may have a non-killer structure in which no killer is provided. In a case of the non-killer structure, carriers annihilate due to recombination without an electric field being applied to the carriers on the rear surface 23 side, and thus it takes time for the carriers to annihilate. Further, in comparison with a diode including a killer and having a short lifetime, a diode with the non-killer structure may have a total amount of charge in the depth direction, which is required for a rated current, increased by one or more orders of magnitude. Since a reverse recovery charge Qrr increases as the total amount of charge increases, it is preferable to reduce an injection efficiency. By adjusting the ratio between the first anode region 81 and the second anode region 82, the semiconductor device 100 of the present example can reduce the injection efficiency so as to achieve the non-killer structure.

Further, since the semiconductor device 100 has the non-killer structure, it is possible to suppress a decrease in a forward-direction voltage Vf of the diode, the decrease being caused by a decrease in density of the killer during long-time energization. Note that the semiconductor device 100 is not limited to the non-killer structure.

The buffer region 20 may be provided below the drift region 18 in each of the transistor portion 70 and the diode portion 80. The conductivity type of the buffer region 20 is the N+ type. The buffer region 20 has a higher doping concentration than that of the drift region 18. The buffer region 20 has one or a plurality of doping concentration peaks of doping concentrations higher than that of the drift region 18. The plurality of doping concentration peaks are arranged at different positions in the depth direction of the semiconductor substrate 10. The doping concentration peak of the buffer region 20 may be, for example, a donor concentration peak of hydrogen or phosphorus. The buffer region 20 may function as a field stop layer which prevents a depletion layer, which extends from a lower end of the base region 14, from reaching the collector region 22 and the first cathode region 91.

In the transistor portion 70, the collector region 22 is provided closer to the rear surface 23 side than the buffer region 20 is. The collector region 22 of the present example is of the P+ type. The collector region 22 has a higher doping concentration than those of the base region 14 and the second anode region 82. The collector region 22 may include the acceptor which is the same as or different from the base region 14. The acceptor of the collector region 22 is, for example, boron.

In the diode portion 80, the first cathode region 91 is provided closer to the rear surface 23 side than the buffer region 20 is. The first cathode region 91 of the present example is of the N+ type. The first cathode region 91 has a higher doping concentration than that of the drift region 18. For example, the doping concentration of the first cathode region 91 is 1E19 $cm^{-3}$ or higher. The donor of the first cathode region 91 is, for example, hydrogen or phosphorus. Note that elements serving as the donors and the acceptors in each region are not limited to the above examples.

The collector region 22 and the first cathode region 91 are exposed on the rear surface 23 of the semiconductor substrate 10 and are electrically connected to the rear surface side electrode 27. The rear surface side electrode 27 may be in contact with the entire rear surface 23 of the semiconductor substrate 10. The front surface side electrode 26 and the rear surface side electrode 27 are formed of a metal material such as aluminum.

The one or more gate trench portions 40 and the one or more dummy trench portions 30 are provided on the front surface 21 side of the semiconductor substrate 10. From the front surface 21 of the semiconductor substrate 10, each trench portion passes through the base region 14 or the second anode region 82 to reach the drift region 18. In a region where at least any of the emitter region 12, the contact region 15, the accumulation region 16, and the first anode region 81 is provided, each trench portion also passes through the doping regions of these to reach the drift region 18. A structure in which the trench portion passes through the doping region is not limited to a structure in which the semiconductor substrate is manufactured in order of forming the doping region and then forming the trench portion. A structure in which the trench portion is formed and then the doping region is formed between the trench portions is also included in the structure in which the trench portion passes through the doping region.

The gate trench portion 40 has a gate trench, a gate dielectric film 42, and a gate conductive portion 44 which are provided on the front surface 21 of the semiconductor substrate 10. The gate dielectric film 42 is provided to cover an inner wall of the gate trench. The gate dielectric film 42 may be formed by oxidizing or nitriding a semiconductor on the inner wall of the gate trench. The gate conductive portion 44 is provided on an inner side further than the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided to be longer, in the depth direction, than the base region 14. The gate trench portion 40 in the cross section is covered with the interlayer dielectric film 38 on the front surface 21 of the semiconductor substrate 10. The gate conductive portion 44 is electrically connected to a gate wiring. When a predetermined gate voltage is applied to the gate conductive portion 44, a channel is formed by an inversion layer with electrons on a surface layer in the base region 14 at an interface in contact with the gate trench portion 40.

The dummy conductive portion 34 may be formed of the same material as the gate conductive portion 44. For example, the dummy conductive portion 34 is formed of a conductive material such as polysilicon. The dummy conductive portion 34 may have the same length, in the depth direction, as the gate conductive portion 44.

The gate trench portion 40 and the dummy trench portion 30 of the present example are covered with the interlayer dielectric film 38 on the front surface 21 of the semiconductor substrate 10. Note that bottom portions of the dummy trench portion 30 and the gate trench portion 40 may have curved surface shapes which are convex downward (curved line shapes in cross sections).

Figure 5C:
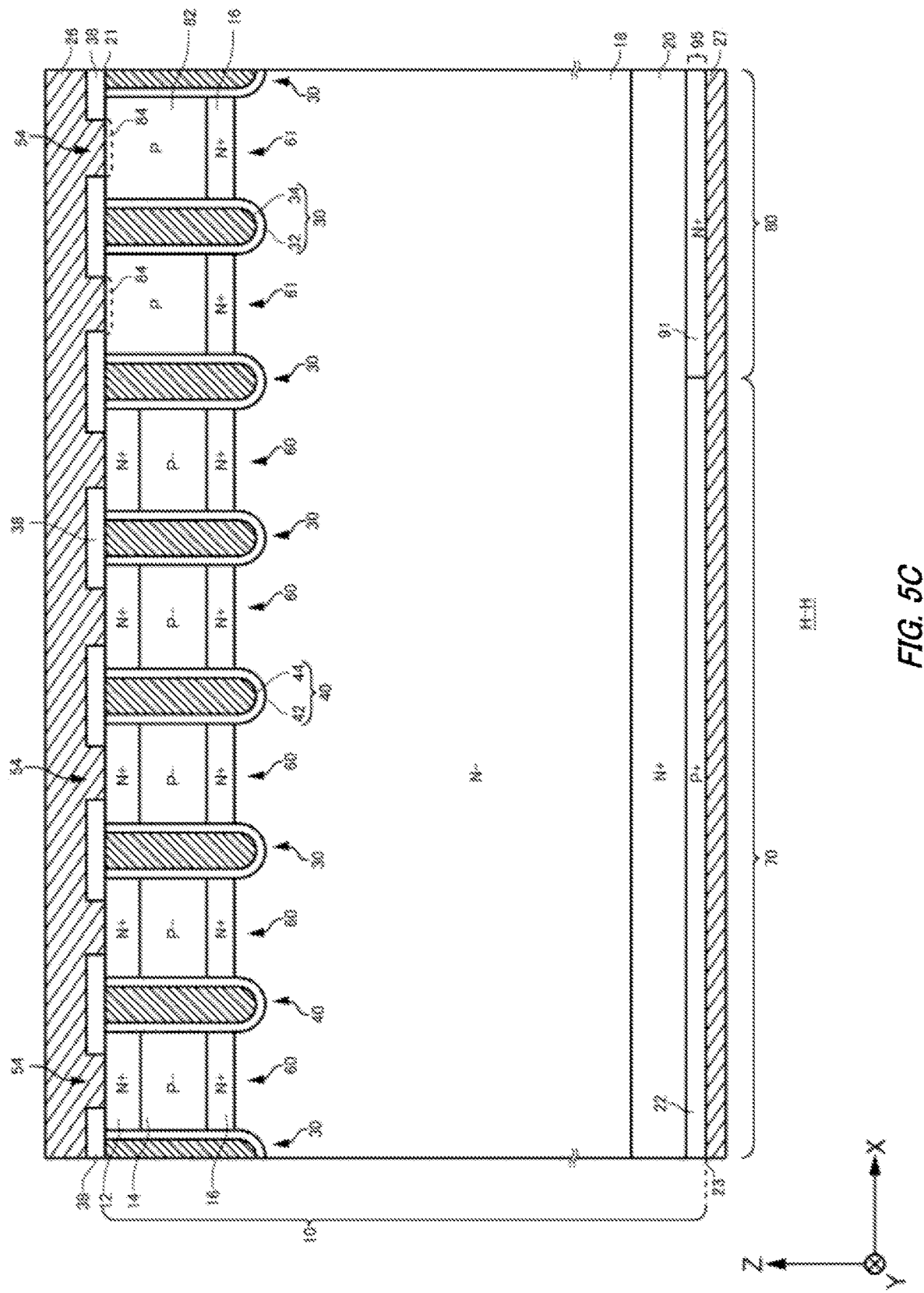
FIG. 5C shows an example of a cross-sectional view of the semiconductor device 100 according to Example 6.

FIG. 5C shows an example of a cross-sectional view of the semiconductor device 100 according to Example 6. FIG. 5C shows an example of a cross section H-H in FIG. 5A. The cross section H-H is a cross section including the second anode region 82 in the front surface 21 of the diode portion 80. In the cross section H-H, the first anode region 81 is not provided in the mesa portion 61. On the front surface 21 of the diode portion 80, as shown by the dashed line, the contact region 84 may be included on the front surface 21 side of the second anode region 82. The contact region 84 may be formed on the front surface 21 where the contact hole 54 is formed in the top plan view. The second anode region 82 is in contact with the interlayer dielectric film 38 except the end portion of the interlayer dielectric film 38. The contact region 84 may enter a region under the end portion of the interlayer dielectric film 38, the region is on the front surface 21 side of the second anode region 82. Between the second anode region 82 and the drift region 18, the accumulation region 16 may be provided.

Figure 5D:
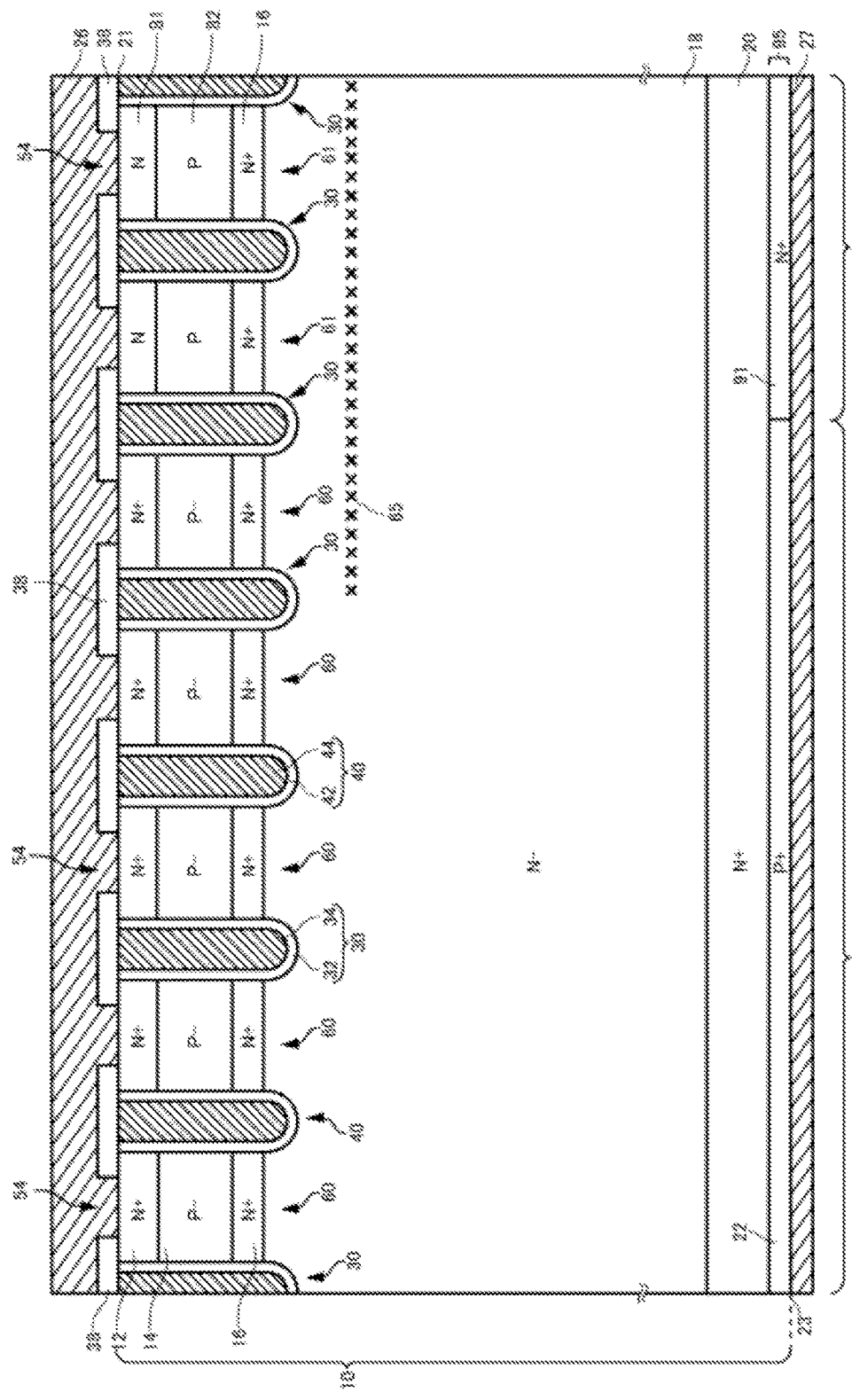
FIG. 5D shows an example of a cross-sectional view of the semiconductor device 100 according to Example 7.

FIG. 5D shows an example of a cross-sectional view of the semiconductor device 100 according to Example 7. FIG. 5D shows another example of the cross section G-G in FIG. 5A. The semiconductor device 100 of the present example is different from the Example of FIG. 5B in that a killer 65 is included.

The killer 65 is provided in the drift region 18. The killer 65 may be a recombination center. The killer 65 of the present example is provided below the accumulation region 16. The killer 65 may be provided also in the mesa portion 60 and the mesa portion 61. The killer 65 controls a lifetime of a carrier to be short. Since the semiconductor device 100 of the present example includes the first anode region 81 and the second anode region 82, it is not necessary to set the killer provided in the drift region 18 to have a high doping concentration.

As an example, the killer 65 is provided by generating a vacancy type lattice defect in the semiconductor substrate 10. For example, vacancy type lattice defects are generated by implanting hydrogen ions. Further, the vacancy defects may be generated by irradiating the semiconductor substrate 10 with charged particles such as helium ions and electron beams other than hydrogen ions. That is, the killer 65 may be the vacancy type lattice defect, may be helium, or may be hydrogen.

Figure 6A:
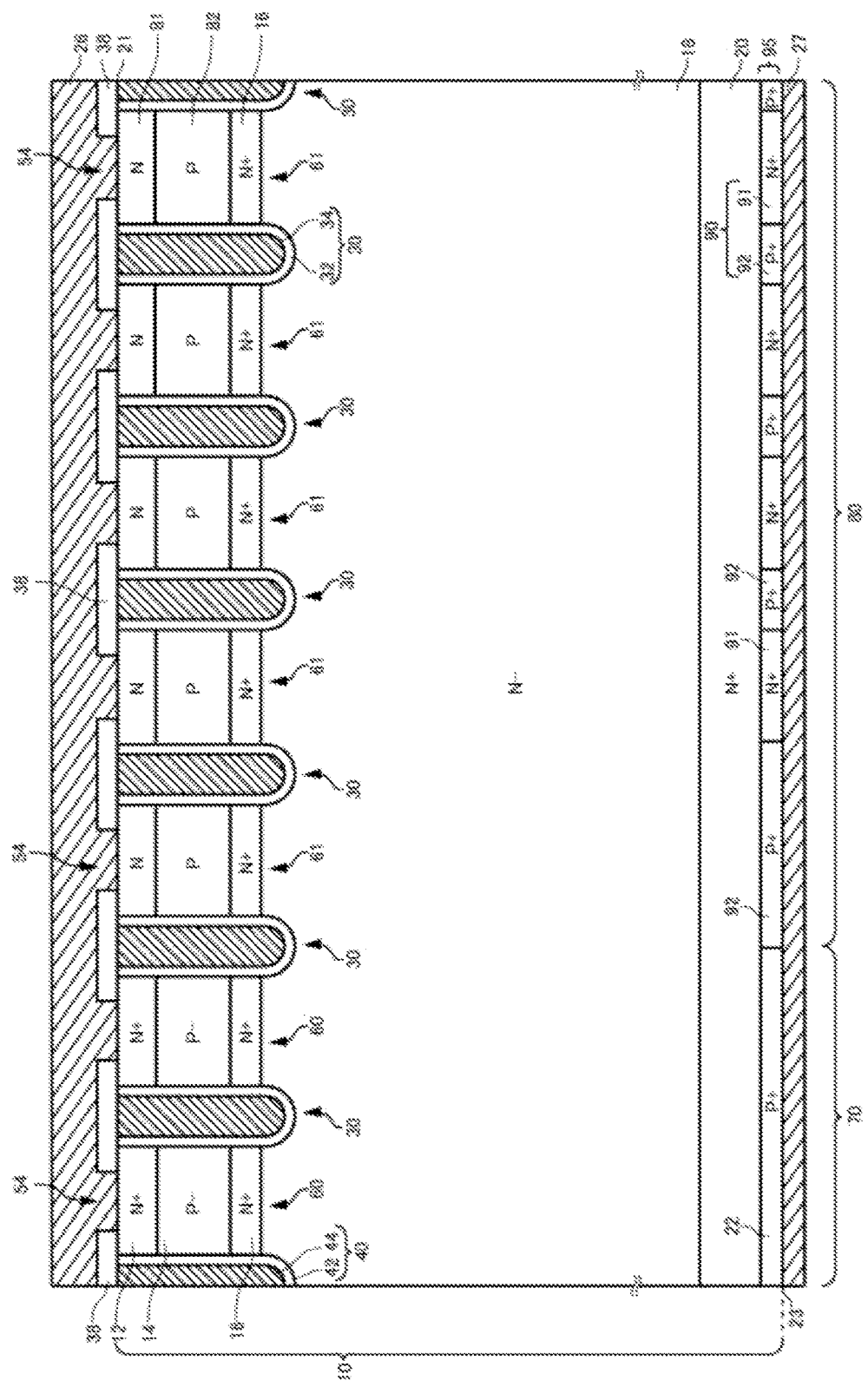
FIG. 6A shows an example of a cross-sectional view of the semiconductor device 100 according to Example 8.

FIG. 6A shows an example of a cross-sectional view of the semiconductor device 100 according to Example 8. FIG. 6A shows another example of the cathode layer 95 near a boundary between the transistor portion 70 and the diode portion 80. The semiconductor device 100 of the present example includes a rear surface side cathode portion 90 as the cathode layer 95. Note that a structure of the cathode layer 95 of the present example may be appropriately applied to another Example.

The rear surface side cathode portion 90 is provided on the rear surface 23. The rear surface side cathode portion 90 includes the first cathode region 91 and a second cathode region 92. The rear surface side cathode portion 90 of the present example has a repeated structure of the first cathode region 91 and the second cathode region 92.

The first cathode region 91 is a region of a first conductivity type. The first cathode region 91 of the present example is of the N+ type. The first cathode region 91 is provided on the rear surface 23 side of the semiconductor substrate 10. The first cathode region 91 is provided in contact with the rear surface side electrode 27.

The second cathode region 92 is a region of a second conductivity type that is provided in direct contact with the first cathode region 91. The second cathode region 92 of the present example is of the P+ type. The second cathode region 92 is provided on the rear surface 23 side of the semiconductor substrate 10. The second cathode region 92 is provided adjacent to the first cathode region 91. The second cathode region 92 of the present example is provided in contact with the first cathode region 91. The second cathode region 92 is provided in contact with the rear surface side electrode 27. For example, a doping concentration of the second cathode region 92 is 1E15 cm$^{-3}$ or higher and 1E18 cm$^{-3}$ or lower.

The semiconductor device 100 of the present example includes both of the first cathode region 91 and the second cathode region 92 as the cathode layer 95. Further, on the rear surface 23, an area of the second cathode region 92 may be greater than an area of the first cathode region 91. In this way, by making an area ratio of the first cathode region 91 of the N+ type small, it is also possible to reduce an efficiency of electron injection from the rear surface 23 side. The first cathode region 91 and the second cathode region 92 preferably have a regularly repeated structure to prevent a current concentration.

Figure 6B:
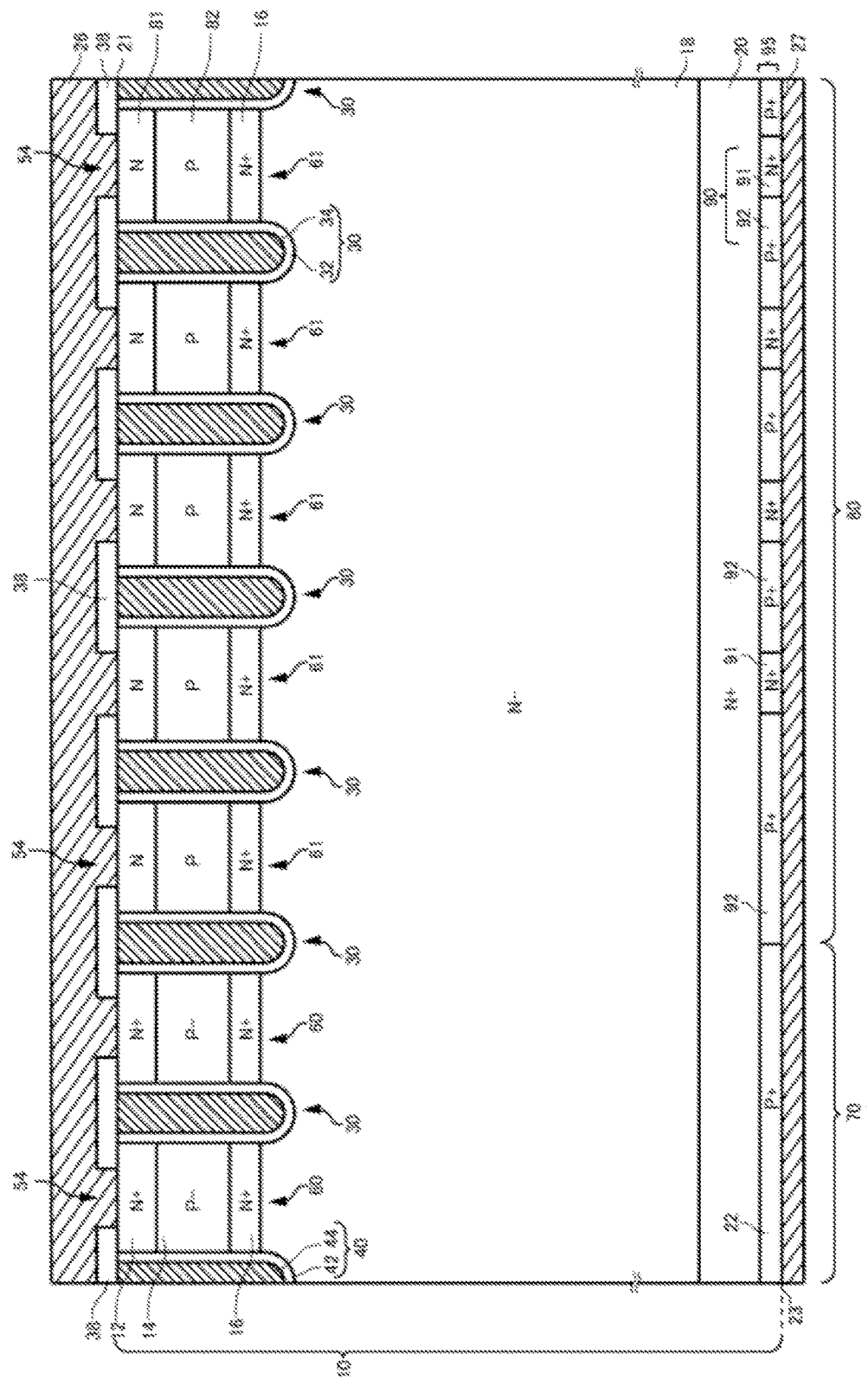
FIG. 6B shows an example of a cross-sectional view of the semiconductor device 100 according to Example 9.
Figure 6B:
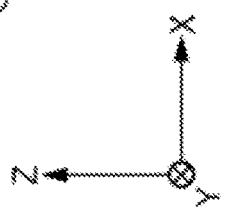

FIG. 6B shows an example of a cross-sectional view of the semiconductor device 100 according to Example 9. In the present example, an area ratio of the first cathode region 91 and the second cathode region 92 provided on the rear surface 23 is different from that in the case of FIG. 6A. Note that the structure of the cathode layer 95 of the present example may be appropriately applied to another Example.

On the rear surface 23, the area of the second cathode region 92 is greater than the area of the first cathode region 91. For example, a width of the second cathode region 92 in the X axis direction is greater than a width of the first cathode region 91 in the X axis direction. The width of the second cathode region 92 in the X axis direction may be 1.5 times or more, or may be 2 times or more of the width of the first cathode region 91 in the X axis direction. On the rear surface 23, by making the area of the second cathode region 92 be greater than the area of the first cathode region 91, it is easy to suppress electron injection from the rear surface 23.

Figure 6C:
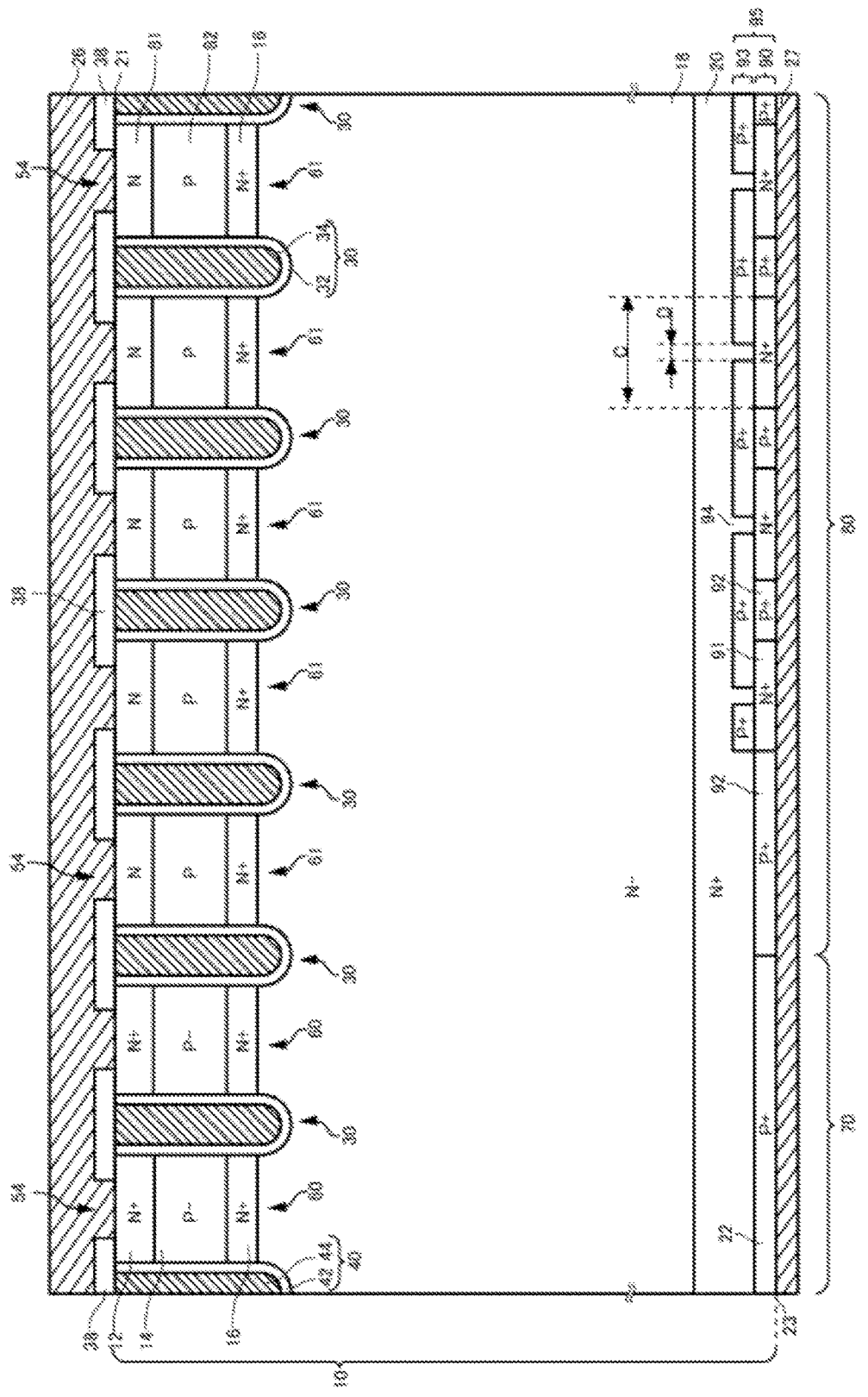
FIG. 6C shows an example of a cross-sectional view of the semiconductor device 100 according to Example 10.

FIG. 6C shows an example of a cross-sectional view of the semiconductor device 100 according to Example 10. FIG. 6C shows another example of the cathode layer 95 near the boundary between the transistor portion 70 and the diode portion 80. The semiconductor device 100 of the present example includes, as the cathode layer 95, two layer structure of the rear surface side cathode portion 90 and a front surface side cathode portion 93. Note that the structure of the cathode layer 95 of the present example may be appropriately applied to another Example.

The rear surface side cathode portion 90 is provided, on the rear surface 23 of the semiconductor substrate 10, in contact with the rear surface side electrode 27. The rear surface side cathode portion 90 includes the first cathode region 91 and a second cathode region 92. The rear surface side cathode portion 90 may have the same structure as the rear surface side cathode portion 90 of FIG. 6A or FIG. 6B. That is, the rear surface side cathode portion 90 has the repeated structure of the first cathode region 91 and the second cathode region 92.

The front surface side cathode portion 93 is a region of a second conductivity type that is provided closer to the front surface side of the semiconductor substrate 10 than the rear surface side cathode portion 90 is. The front surface side cathode portion 93 of the present example is provided adjacent to the first cathode region 91 and the second cathode region 92. For example, the front surface side cathode portion 93 is provided in contact with the first cathode region 91 and the second cathode region 92. The front surface side cathode portion 93 has an opening 94.

Further, the front surface side cathode portion 93 may be formed at the same time as the second cathode region 92 of the rear surface side cathode portion 90. That is, ion implantation for forming the second cathode region 92 and the front surface side cathode portion 93 may be executed by the same step.

The opening 94 is provided on a front surface side of the first cathode region 91. A diameter D of the opening 94 is smaller than a width C of the first cathode region 91 in the trench array direction (the X axis direction). The diameter D of the opening 94 may be half or less of the width C of the first cathode region 91. By adjusting the diameter D of the opening 94, the efficiency of the electron injection may be further adjusted. For example, by making the diameter D of the opening 94 small, the efficiency of the electron injection is reduced.

Figure 6D:
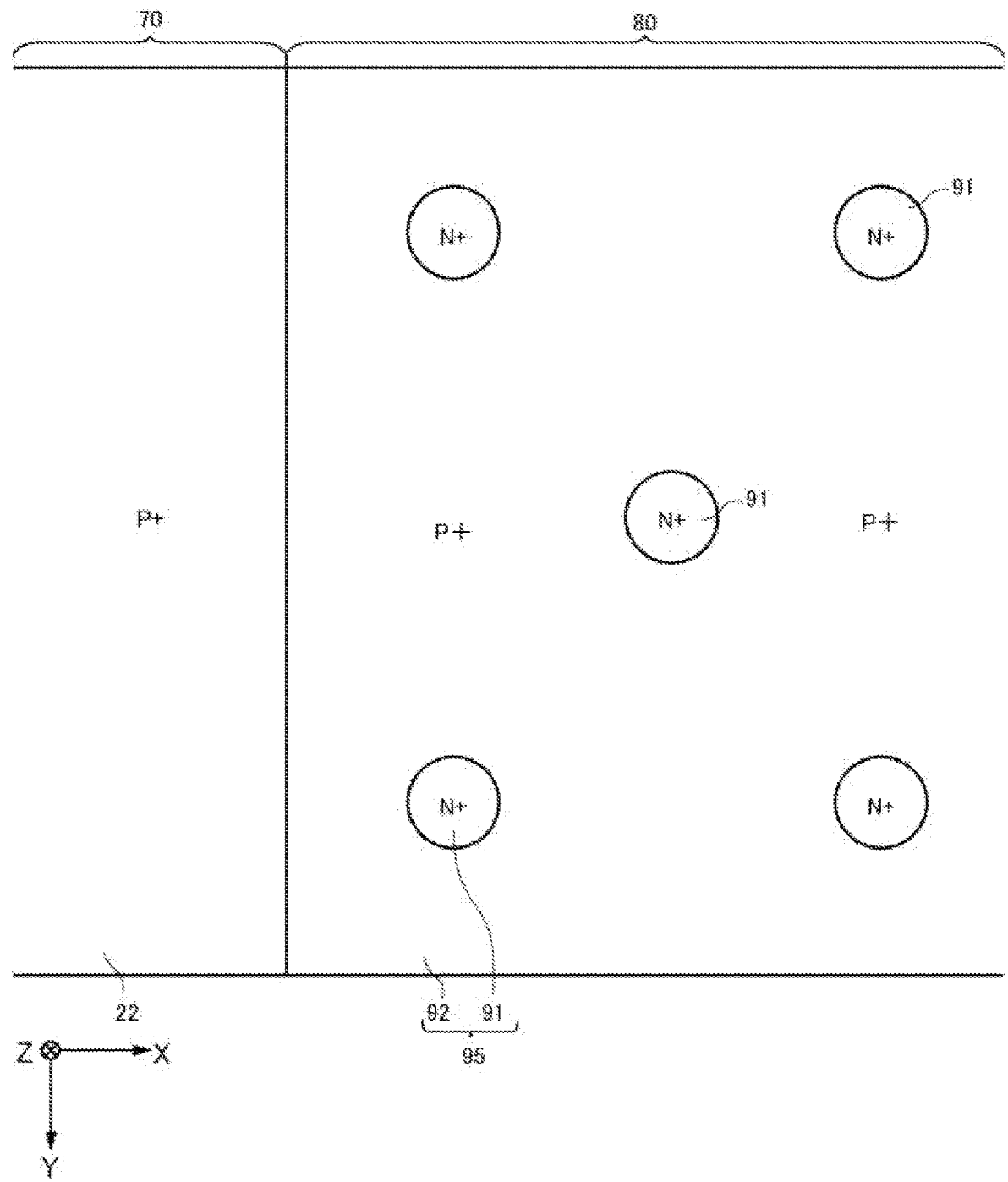
FIG. 6D shows an example of a bottom view of a rear surface 23 of the semiconductor device 100 according to Example 11.

FIG. 6D shows an example of a bottom view of a rear surface 23 of the semiconductor device 100 according to Example 11. FIG. 6D is a view of the rear surface 23 of the semiconductor substrate 10 viewed from a negative side to a positive side in the Z axis direction. The semiconductor device 100 of the present example includes the first cathode region 91 and the second cathode region 92 as the cathode layer 95. Note that the structure of the cathode layer 95 of the present example may be appropriately applied to another Example.

The first cathode region 91 has a perfect circular shape with a predetermined diameter on the rear surface 23. The shape of the first cathode region 91 may be an ellipse or a shape other than a circle. The first cathode region 91 is regularly provided on the rear surface 23. For example, the first cathode region 91 has a structure in which four perfect circles are arranged around one perfect circle at equal intervals. Note that the arrangement of the first cathode region 91 may be irregular. The first cathode region 91 may be provided in the diode portion 80 rather than in the transistor portion 70.

On the rear surface 23, the area of the first cathode region 91 may be smaller than the area of the second cathode region 92. Due to this, the efficiency of the electron injection from the rear surface 23 side is reduced. On the rear surface of the semiconductor substrate 10, the area of the first cathode region 91 may be equal to or smaller than 50%, equal to or smaller than 25%, or equal to or smaller than 10% of the total area of the first cathode region 91 and the second cathode region 92. On the rear surface of the semiconductor substrate 10 in the present example, the area of the first cathode region 91 is equal to or smaller than 10% of the total area of the first cathode region 91 and the second cathode region 92. The area ratio between the first cathode region 91 and the second cathode region 92 is not limited to the present example.

Figure 7A:
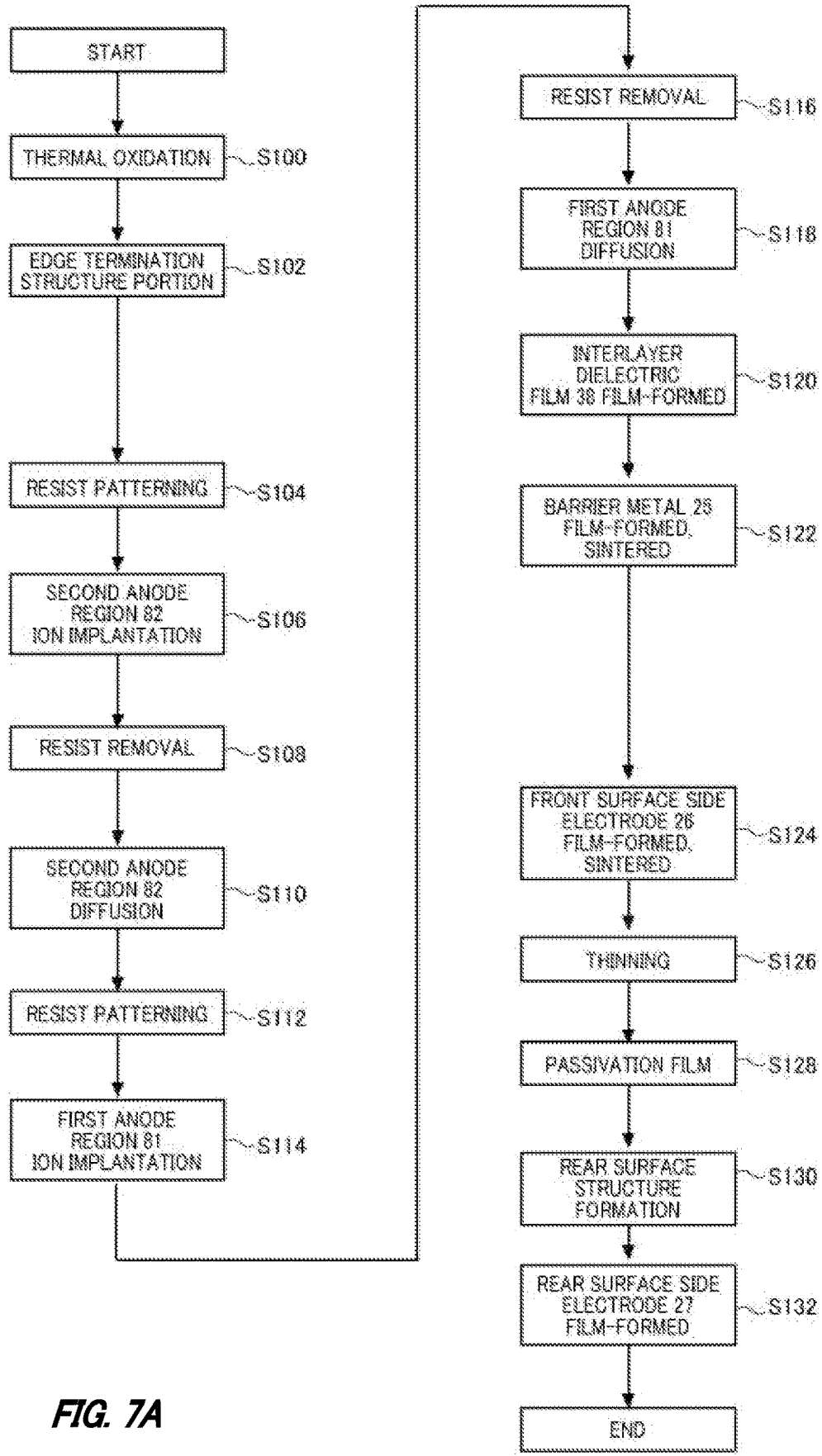
FIG. 7A shows an example of a manufacturing method for the semiconductor device 100 of the planar type.

FIG. 7A shows an example of a manufacturing method for the semiconductor device 100 of the planar type. A flowchart of the present example shows steps when the semiconductor device 100 including the diode portion 80 is manufactured. The manufacturing method of the present example includes step S100 to step S132. Note that it is not essential to include all steps, and each step can be omitted or changed.

In step S100, the semiconductor substrate 10 is thermally oxidized. For example, a temperature of the thermal oxidation step is 1200° C. In step S102, an edge termination structure portion is formed at an end portion of the front surface 21 of the semiconductor substrate 10. For example, a guard ring of a P+ type is provided as the edge termination structure portion.

In step S104, a resist for ion implantation into the second anode region 82 is patterned. In step S106, the second anode region 82 is formed by the ion implantation. The second anode region 82 may be formed by uniform ion implantation from the front surface 21 side. For example, boron ions are implanted on condition that acceleration energy is from 100 keV to 300 keV and that the dose is from 1E13 $cm^{-2}$ to 1E14 $cm^{-2}$. In step S108, the resist is removed. In step S110, the second anode region 82 is formed by a diffusion step. For example, the diffusion is performed on condition that the temperature is from 1050° C. to 1200° C. and that the time is 1 hour or more and 3 hours or less.

In step S112, a resist for ion implantation into the first anode region 81 is patterned. In step S114, ion implantation into the first anode region 81 is performed. For example, phosphorus ions are implanted on condition that the dose is from 2E13 $cm^{-2}$ to 2E14 $cm^{-2}$ and that acceleration energy is from 50 keV to 250 keV. That is, the acceleration energy of the dopant in the first anode region 81 is lower than the acceleration energy of the dopant in the second anode region 82. In step S116, the resist is removed. In step S118, the first anode region 81 is formed by a diffusion step. For example, the diffusion is performed on condition that the temperature is from 1000° C. to 1150° C. and that the time is from 1 hour to 3 hours.

In step S120, the interlayer dielectric film 38 is film-formed on the front surface 21 of the semiconductor substrate 10. For example, the interlayer dielectric film 38 is an HTO film, a BPSG film, or a layered film of these. As an example, the interlayer dielectric film 38 has a film thickness of 1.5 μm and reflows at 970° C. In step S122, the interlayer dielectric film 38 is opened. After the opening, the interlayer dielectric film 38 may be annealed at 950° C. The barrier metal 25 is film-formed, in a region where the interlayer dielectric film 38 is opened, so as to be sintered. Materials of the barrier metal 25 may include at least one of Ti, V, Ni, Mo, W, Pd, Cr, and Pt. As an example, the barrier metal 25 is film-formed by sputtering. For example, a film thickness of the barrier metal 25 is 500 Å. A sintering temperature may be 600° C. or higher and 900° C. or lower.

In step S124, the front surface side electrode 26 is film-formed. For example, the front surface side electrode 26 is an aluminum-silicon (Al—Si) film which is film-formed by the sputtering. As an example, a film thickness of the Al—Si film is 5 μm. Then, the Al—Si film may be sintered at about 420° C.

In step S126, the semiconductor substrate 10 is thinned by processing such as backgrinding. The rear surface 23 of the present example may be a surface subjected to grinding such as the backgrinding. Due to the thinning, the semiconductor substrate 10 may have a final thickness of about 120 μm. In step S128, a passivation film is film-formed. For example, the passivation film is a polyimide film.

In step S130, a rear surface structure of the semiconductor device 100 is formed. The rear surface structure of the semiconductor device 100 includes the collector region 22, the cathode layer 95, the buffer region 20, and the like. Protons may be implanted into the buffer region 20. Further, lifetime control processing may be executed on the buffer region 20 by implanting helium ions or electron beams.

In step S132, the rear surface side electrode 27 is formed. For example, Al, Ti, Ni, and Au are film-formed by sputtering to form the rear surface side electrode 27.

Figure 7B:
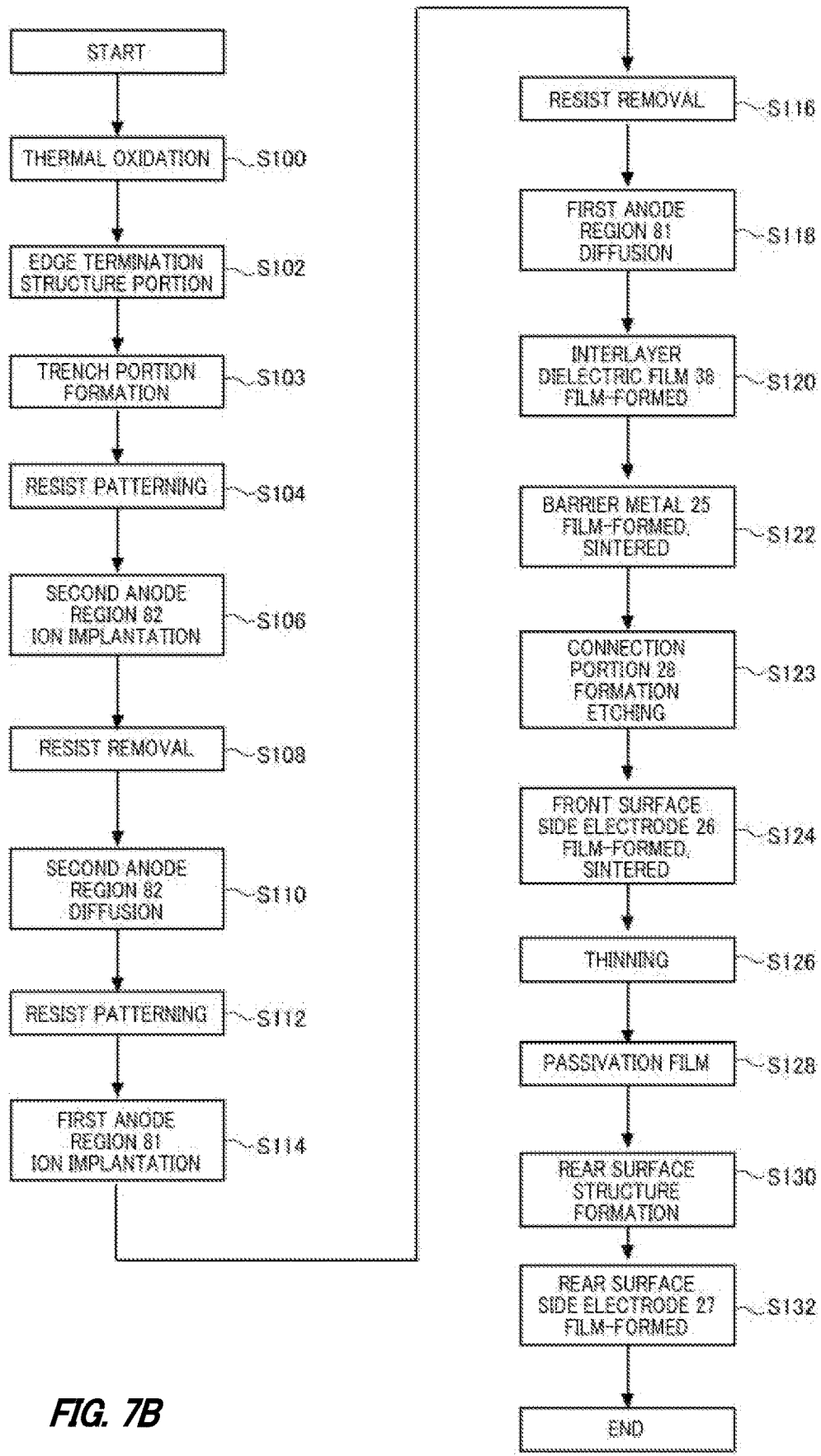
FIG. 7B shows an example of a manufacturing method for the semiconductor device 100 of the trench type.

FIG. 7B shows an example of a manufacturing method for the semiconductor device 100 of the trench type. The manufacturing method of the present example is a manufacturing method when the semiconductor device 100 has the trench portion. In the present example, differences from FIG. 7A will be particularly described.

In step S103, the trench portion is formed on the front surface 21 of the semiconductor substrate 10. More specifically, a trench etching step, a sacrificial oxidation step, a gate oxidation step, a polysilicon formation step, and the like are included. As a result, the dummy trench portion 30 that includes the dummy trench, the dummy dielectric film 32, and the dummy conductive portion 34 is formed. As an example, step S103 is executed between step S102 and step S104 in FIG. 7A.

In step S123, the connection portion 28 is formed. The connection portion 28 may be formed of tungsten, and may have a film thickness of 0.5 μm. The connection portion 28 may be film-formed by an etching method or a lift-off method. The connection portion 28 of the present example is film-formed by the etching method. As an example, step S123 is executed between step S122 and step S124 in FIG. 7A.

Note that in a case of the RC-IGBT, the base region 14 may be formed by the same step as the second anode region 82. In this case, the base region 14 may have the same depth as the second anode region 82. The gate trench portion 40 may be formed by the same process as the dummy trench portion 30.

Figure 8:
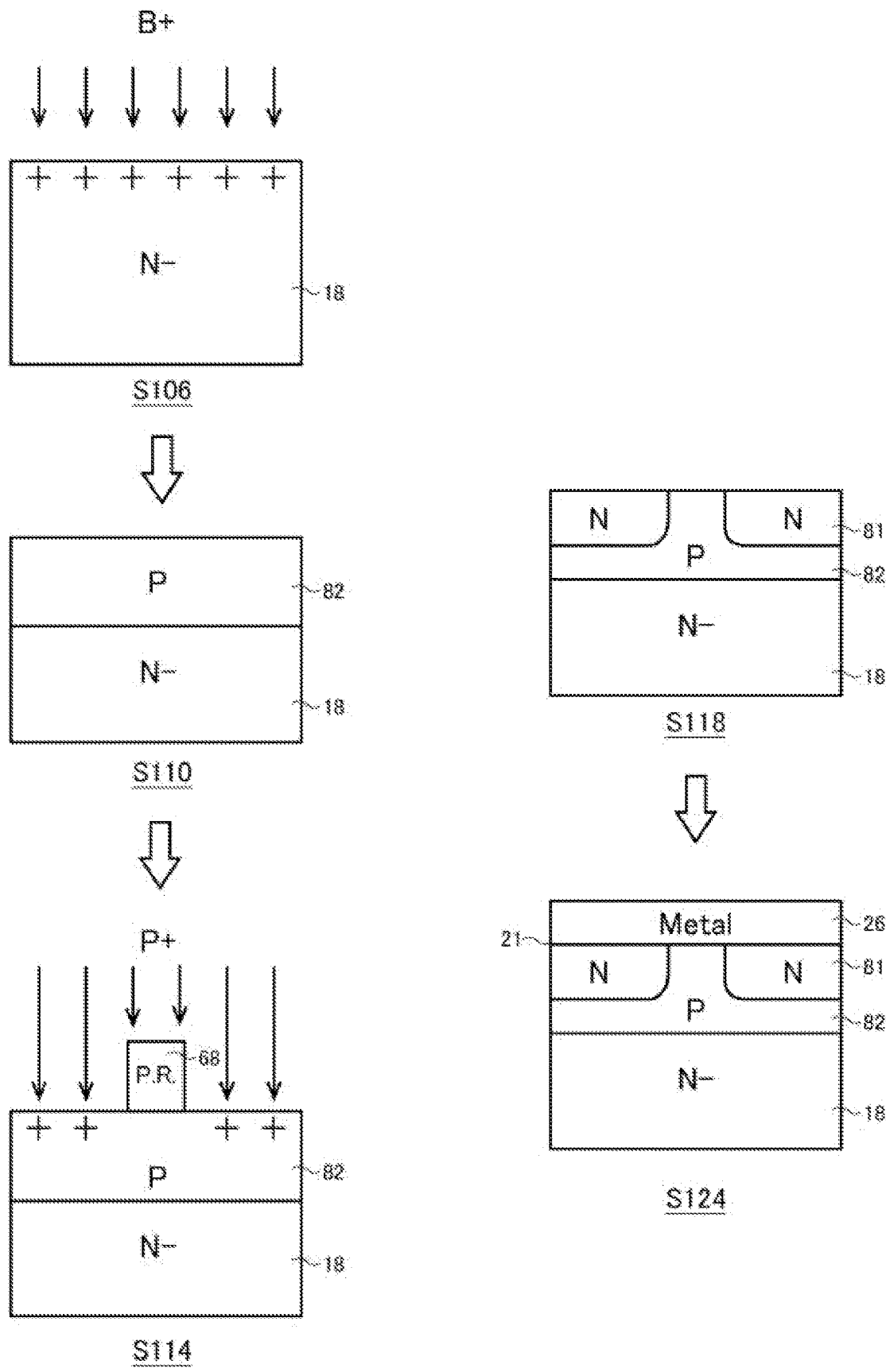
FIG. 8 shows an example of manufacturing steps of a first anode region 81 and a second anode region 82.

FIG. 8 shows an example of manufacturing steps of a first anode region 81 and a second anode region 82. The steps S in FIG. 8 correspond to the steps in each of FIG. 7A and FIG. 7B.

In step S106, boron ions are implanted into the semiconductor substrate 10 of the N− type. As a result, the second anode region 82 is formed on the front surface 21 side of the semiconductor substrate 10 as shown in step S110.

In step S114, phosphorus ions are implanted via a resist 68. The first anode region 81 is provided above the second anode region 82 by the diffusion step of step S118. In step S124, the front surface side electrode 26 is provided above the front surface 21.

Figure 9A:
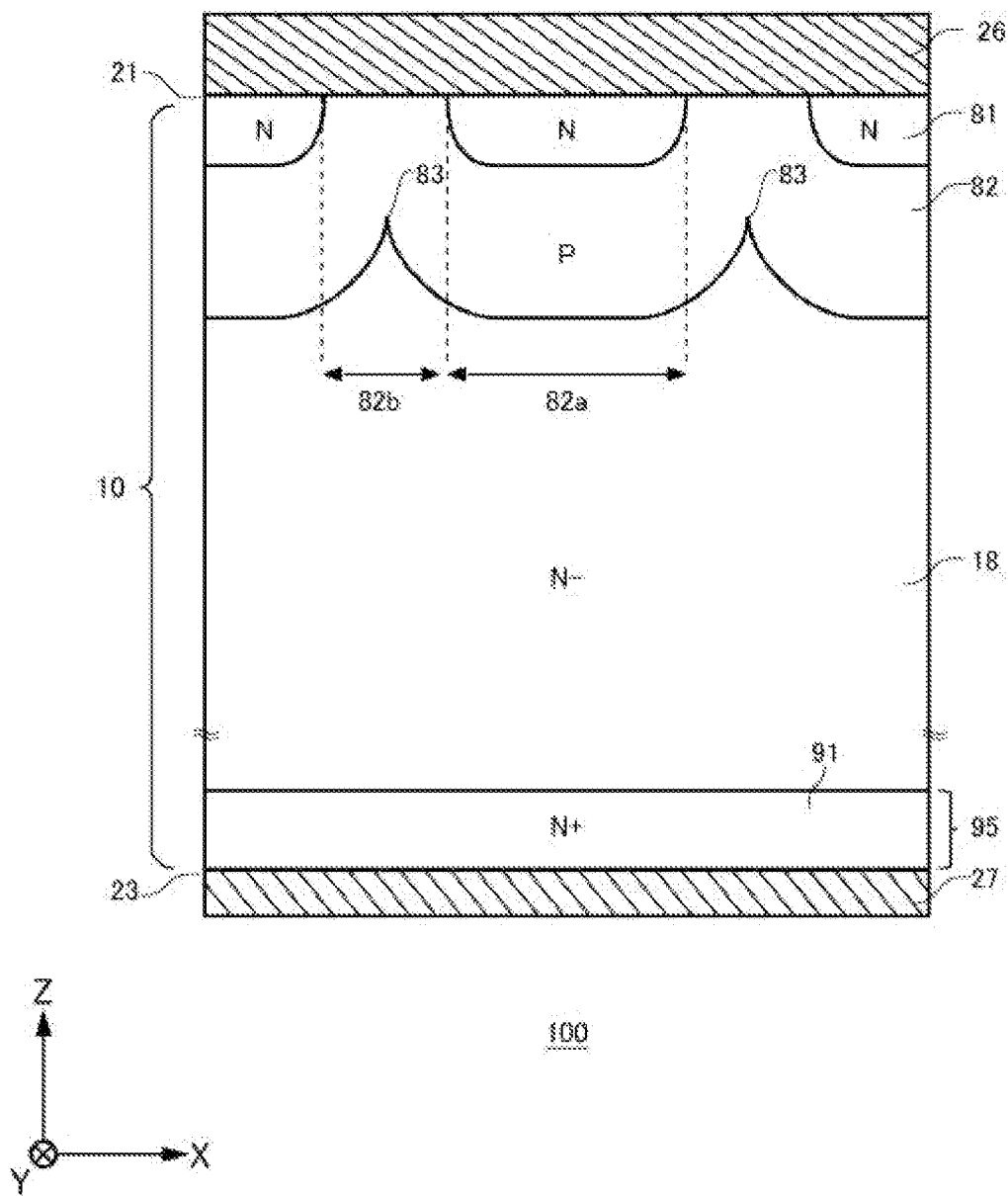
FIG. 9A shows Modification Example of a cross-sectional view of the semiconductor device 100 of a planar type.

FIG. 9A shows Modification Example of a cross-sectional view of the semiconductor device 100 of a planar type or a trench type. The semiconductor device 100 of the present example includes a second anode region 82 having a structure different from that of FIG. 1A. In the present example, differences from FIG. 1A will be described. The second anode region 82 of the present example includes a second anode region 82*a* and a second anode region 82*b*.

The second anode region 82*a* is a region which is not in contact with the front surface side electrode 26 on the front surface 21. Above the second anode region 82*a* of the present example, the first anode region 81 is provided. A thickness of the second anode region 82*a* in the depth direction is set such that the depletion layer generated at the PN junction between the second anode region 82 and the drift region 18 does not come into contact with the first anode region 81.

The second anode region 82*b* is a region which is in contact with the front surface side electrode 26 on the front surface 21. The second anode region 82*b* of the present example is provided between adjacent first anode regions 81. A doping concentration of the second anode region 82*b* may be lower than a doping concentration of the second anode region 82*a* when compared at the same depth. Further, a depth of a lower end of the second anode region 82*b* may be shallower than a depth of a lower end of a depth of the second anode region 82*a*.

In the top plan view, a structure of the front surface 21 of the semiconductor device 100 may be the same as the structure of the front surface 21 of FIG. 1A. That is, the semiconductor device 100 of the present example may include the first anode region 81 and the second anode region 82 that are provided in a stripe pattern, as shown in FIG. 1B. The semiconductor device 100 may also have a plurality of circular second anode regions 82, as shown in FIG. 1C.

Note that in the top plan view, the front surface 21 of the semiconductor device 100 of the present example may be applied to a structure of the front surface 21 of the semiconductor device 100 according to another Example. That is, the structure of FIG. 9A may be applied not only to the semiconductor device 100 of the planar type, as in FIG. 1B and FIG. 1C, but also to the semiconductor device 100 of the trench type as in FIG. 2A or FIG. 3A. When applied to the semiconductor device 100 of the trench type, the cross-sectional view of the present example may have the same structure as the cross section taken along the extension direction of the trench portion.

A portion 83 is a shallowest portion of a lower end of the second anode region 82*b* in the depth direction. The shallowest portion 83 of the lower end of the second anode region 82*b* may be located at the center of the second anode region 82*b* in the top plan view. For example, when the first anode region 81 and the second anode region 82 are provided in a stripe pattern, the shallowest portion 83 of the lower end of the second anode region 82*b* is provided at the center position in a direction in which the stripes are arrayed. Further, when the second anode region 82*b* is provided in a circular shape, the shallowest portion 83 of the lower end of the second anode region 82*b* may be provided at the center position of a circle of the second anode region 82*b*. In other words, the shallowest portion of the second anode region 82*b* may be located between the adjacent first anode regions 81 in the top plan view.

Note that in the present example as well, the semiconductor device 100 may include the contact region 84 on the front surface 21 side of the second anode region 82 as in FIG. 1A, or may not. The semiconductor device 100 of the present example does not include the contact region 84.

The semiconductor device 100 of the present example can suppress the hole injection from a contact surface between the second anode region 82*b* and the front surface side electrode 26. The semiconductor device 100 can also prevent the punch-through of the depletion layer generated at the PN junction between the second anode region 82 and the drift region 18. Accordingly, the semiconductor device 100 can reduce the reverse recovery current even with a non-killer diode having no lifetime killer. The semiconductor device 100 can also reduce accumulated charges (Qrr) to achieve soft recovery characteristics.

Figure 9B:
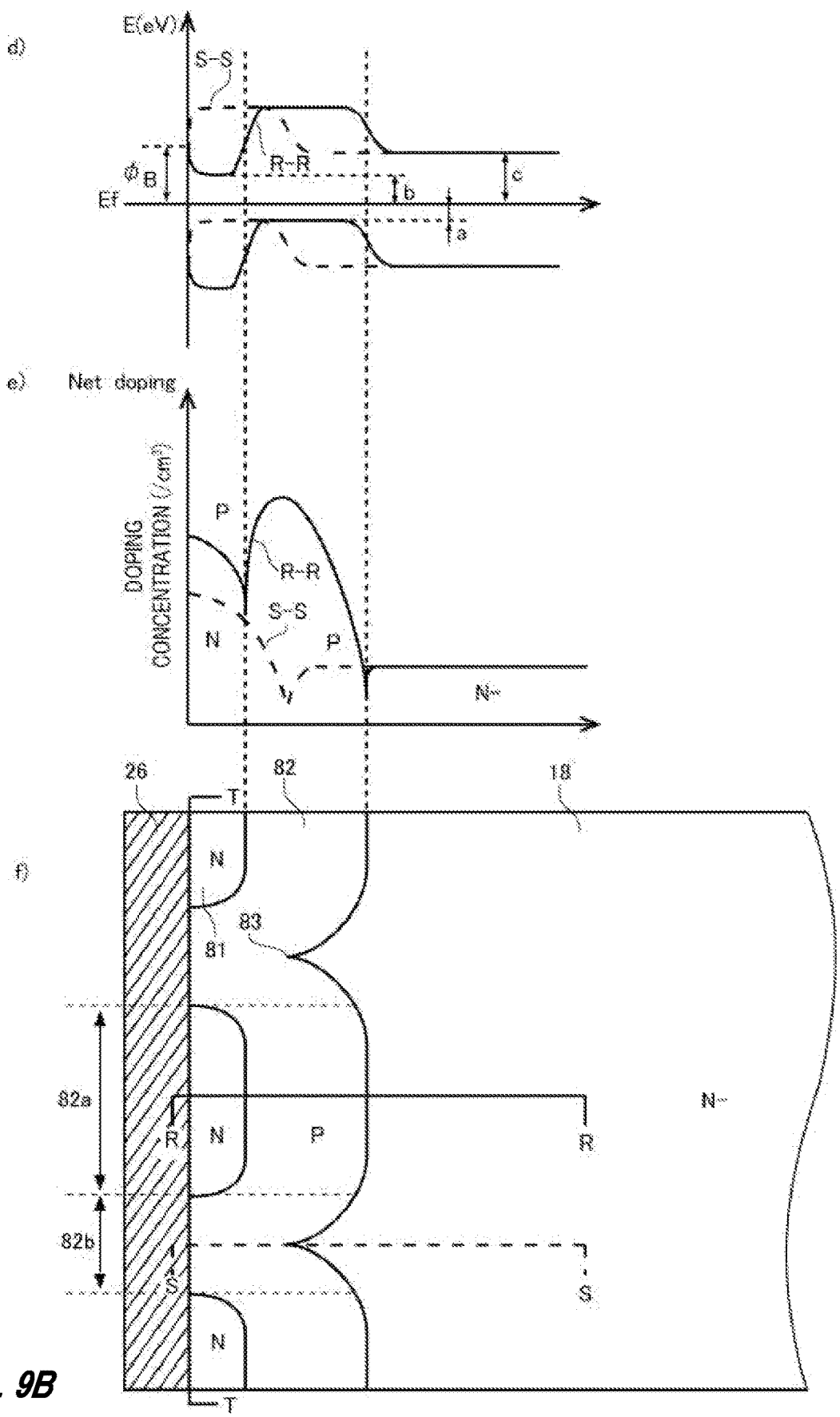
FIG. 9B shows examples of doping concentration distribution and an energy band diagram of the semiconductor device 100 according to FIG. 9A in the depth direction.

FIG. 9B shows examples of doping concentration distribution and an energy band diagram of the semiconductor device 100 according to FIG. 9A in the depth direction. The present example shows a cross-sectional view f) of the semiconductor device 100, and doping concentration distribution e) and an energy band diagram d) of the semiconductor device 100 in the depth direction. In d) to f) of FIG. 9B, the positions of the depth direction correspond to each other. FIG. 9B corresponds to a case where the contact region 84 is not included. FIG. 9B shows examples of doping concentration distribution and an energy band diagram of the semiconductor device 100 at line R-R and line S-S.

The line R-R is the same as the P-P line in FIG. 1D in terms of doping concentration distribution and an energy band diagram. In the present example, differences from the case of FIG. 1D will be particularly described. The line S-S corresponds to a cross section that passes through the shallowest portion 83 of the lower end of the second anode region 82*b* in the second anode region 82*b*.

The dashed line in the band diagram d) shows the band diagram in a thermal equilibrium state at the line S-S. The second anode region 82*b* is in ohmic contact with the front surface side electrode 26. A boundary between the second anode region 82*b* and the drift region 18 is provided at a position shallower than a boundary between the second anode region 82*a* and the drift region 18.

The dashed line of the doping concentration distribution e) shows the doping concentration at the line S-S. A doping concentration of the contact surface of the second anode region 82*b* with the front surface side electrode 26 is lower than that of the contact surface of the first anode region 81 with the front surface side electrode 26. Further, a minimum doping concentration of the second anode region 82*b* in contact with the front surface side electrode 26 is lower than the doping concentration of the first anode region 81. A doping concentration of the second anode region 82b is lower than the doping concentration of the first anode region 81.

By reducing the doping concentration of the second anode region 82b, the hole injection from the contact surface between the second anode region 82 and the front surface side electrode 26 is reduced. On the other hand, below the first anode region 81, the second anode region 82a having a higher doping concentration than that of the second anode region 82b is provided, and thus the punch-through of the depletion layer can be prevented.

Figure 9C:
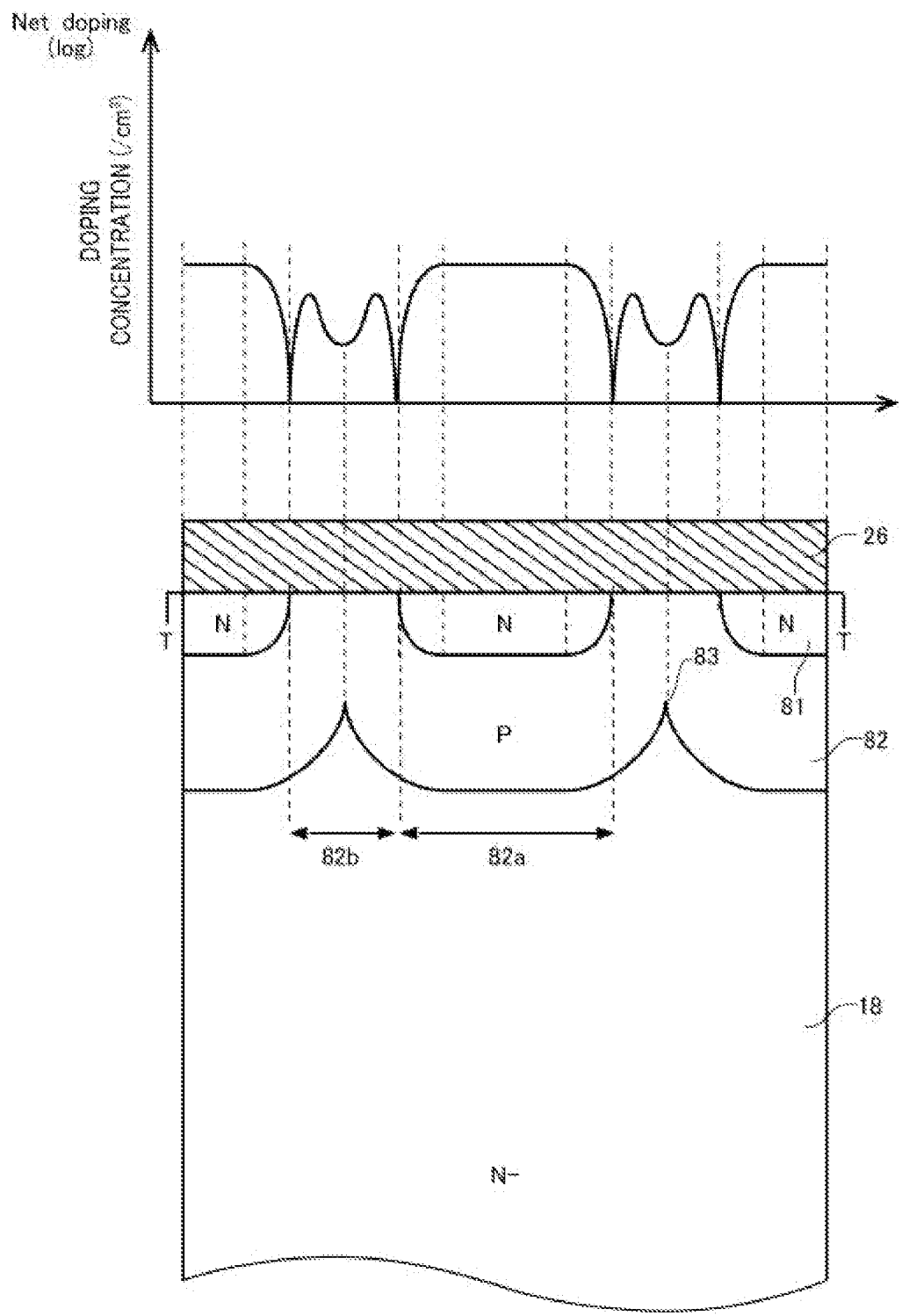
FIG. 9C shows net doping concentration distribution of the front surface 21 in a cross section T-T off) of FIG. 9B.

FIG. 9C shows net doping concentration distribution of the front surface 21 in a cross section T-T off) of FIG. 9B. FIG. 9C also corresponds to the case where the contact region 84 is not included. The first anode region 81 has doping concentration distribution that is substantially flat in the X axis direction. The doping concentration distribution of the first anode region 81 decreases near the position where the PN junction with the second anode region 82 is exposed on the front surface 21.

The second anode region 82 shows doping concentration distribution having a local minimum value in the central portion (that is, the center portion interposed between the first anode regions 81) along the X axis direction. The doping concentration distribution of the second anode region 82 has a local maximum value which is a value of the doping concentration increased from the local minimum value, from the central portion toward the position where the PN junction with the first anode region 81 is exposed on the front surface 21. The doping concentration distribution of the second anode region 82 decreases from a position showing the local maximum value toward the position where the PN junction with the first anode region 81 is exposed on the front surface 21.

The maximum doping concentration of the first anode region 81 on the front surface 21 may be higher than the local minimum value of the doping concentration of the second anode region 82 on the front surface 21. The maximum doping concentration of the first anode region 81 on the front surface 21 may be greater than the local maximum value of the doping concentration of the second anode region 82 on the front surface 21. This makes it possible to suppress the hole injection from the contact surface between the second anode region 82b and the front surface side electrode 26. The semiconductor device 100 can also prevent the punch-through of the depletion layer generated at the PN junction between the second anode region 82 and the drift region 18. Accordingly, the semiconductor device 100 can reduce the reverse recovery current even with the non-killer diode having no lifetime killer. The semiconductor device 100 can also reduce accumulated charges (Qrr) to achieve the soft recovery characteristics.

Note that when the contact region 84 is included, the cross section T-T may be a cross section at a position deeper than a depth at which the contact region 84 is in contact with the second anode region 82.

Figure 10:
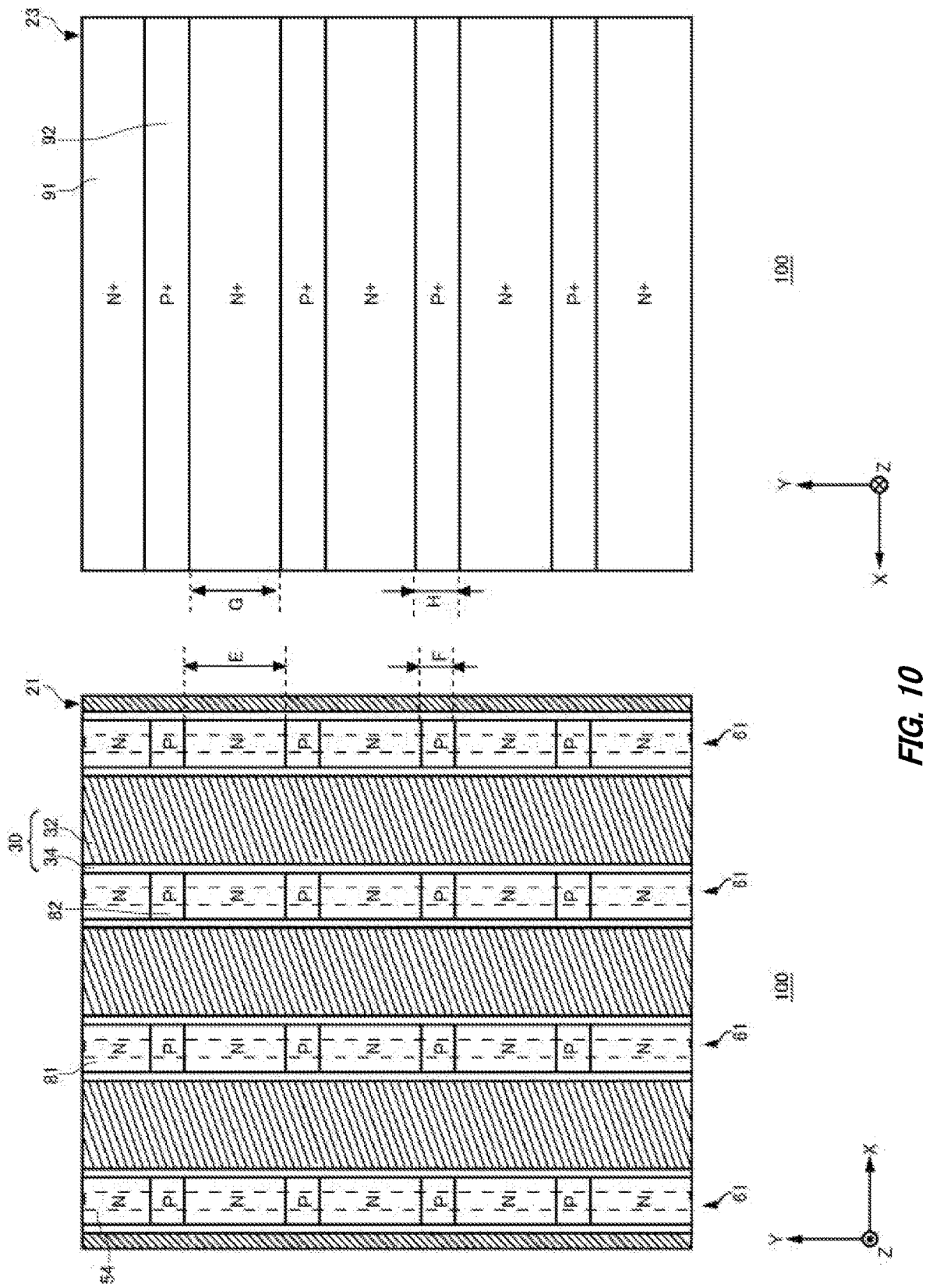
FIG. 10 is a diagram that describes a corresponding relationship between the front surface 21 and the rear surface 23.

FIG. 10 is a diagram that describes a corresponding relationship between the front surface 21 and the rear surface 23. The first anode region 81 and the second anode region 82 on the front surface 21 are arranged to have a predetermined positional relationship with the first cathode region 91 or the second cathode region 92 on the rear surface 23. That is, the structure of the front surface 21 is associated with the structure of the rear surface 23.

The first anode region 81 and the second anode region 82 are alternately arranged in the mesa portion 61 along the Y axis direction. The dummy trench portions 30 are provided to extend in the Y axis direction, and are arrayed in the X axis direction. The first cathode region 91 and the second cathode region 92 are provided to extend in the X axis direction, and are alternately arranged along the Y axis direction.

The first anode region 81 is provided at a position corresponding to the first cathode region 91. The first cathode region 91 is provided below the first anode region 81. That is, the first anode region 81 covers the first cathode region 91 in the top plan view.

The second anode region 82 is provided at a position corresponding to the second cathode region 92. The second cathode region 92 having an area greater than that of the second anode region 82 is provided below the second anode region 82. That is, the second cathode region 92 covers a periphery of the second anode region 82 in the top plan view.

A width E is a width of the first anode region 81 in the Y axis direction on the front surface 21. A width F is a width of the second anode region 82 in the Y axis direction on the front surface 21. The width E in the present example is greater than the width F. This makes it easy to suppress the hole injection from the contact surface between the second anode region 82 and the front surface side electrode 26.

A width G is a width of the first cathode region 91 in the Y axis direction on the rear surface 23. A width H is a width of the second cathode region 92 in the Y axis direction on the rear surface 23. The width G in the present example is greater than the width H. The width H may be greater than the width F. The width G may be smaller than the width E. This makes it easier to suppress the electron injection from the rear surface 23.

In the front surface 21 and the rear surface 23 of the semiconductor device 100 of the present example, a region of a first conductivity type and a region of a second conductivity type are associated with each other. In the semiconductor device 100, by appropriately setting a ratio between the region of the first conductivity type and the region of the second conductivity type, it is possible to suppress the hole injection from the front surface 21 and the electron injection from the rear surface 23 during the conduction time.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A manufacturing method for a semiconductor diode, the manufacturing method comprising:
providing an anode electrode on a front surface side of a semiconductor substrate;
providing a drift region of a first conductivity type in the semiconductor substrate;

providing a first anode region of the first conductivity type that is in Schottky contact with the anode electrode; and providing a second anode region of a second conductivity type that is different from the first conductivity type, wherein the first anode region has a doping concentration lower than or equal to a doping concentration of the second anode region, and is spaced from the drift region by the second anode region, and wherein on the front surface of the semiconductor substrate, an area of the first anode region is greater than an area of the second anode region.

2. The manufacturing method according to claim 1, wherein the doping concentration of the first anode region is 1E15 cm$^{-3}$ or higher and 1E18 cm$^{-3}$ or lower.

3. The manufacturing method according to claim 1, wherein a depth of a lower end of the first anode region is shallower than half a depth of a lower end of the second anode region.

4. The manufacturing method according to claim 1, wherein a depth of a lower end of the first anode region is shallower than half a depth of a lower end of the second anode region.

5. The manufacturing method according to claim 1, wherein a thickness of the second anode region in a depth direction below the first anode region is equal to or greater than 0.5 μm.

6. The manufacturing method according to claim 1, wherein a depth of a lower end of the second anode region in a region in contact with the anode electrode is shallower than a depth of a lower end of the second anode region provided below the first anode region.

7. The manufacturing method according to claim 6, wherein a shallowest portion of the lower end of the second anode region is located at the center of the region where the second anode region is in contact with the anode electrode in a top plan view.

8. The manufacturing method according to claim 1, further comprising:

providing a plurality of trench portions, wherein the first anode region is provided in a mesa portion of the semiconductor substrate that is provided between the plurality of trench portions, and is in contact with the plurality of trench portions at both ends of the mesa portion.

9. The manufacturing method according to claim 8, wherein the first anode region and the second anode region are alternately arranged in a mesa longitudinal direction.

10. The manufacturing method according to claim 8, wherein on the front surface of the semiconductor substrate, an area of the second anode region is equal to or smaller than 1% of a total area of the mesa portion interposed between the plurality of trench portions.

11. The manufacturing method according to claim 8, wherein in any mesa portion of a plurality of mesa portions interposed between the plurality of trench portions, an upper surface of the second anode region is entirely covered with the first anode region.

12. The manufacturing method according to claim 8, wherein the plurality of trench portions have structures in which a trench width gradually increases from a front surface toward a rear surface of the semiconductor substrate, and wherein a width of the mesa portion on the front surface is smaller than a maximum trench width of the plurality of trench portions.

13. The manufacturing method according to claim 8, further comprising:

providing a plurality of accumulation regions of the first conductivity type that have a higher doping concentration than a doping concentration of the drift region, wherein a depth of a lower end of the first anode region is deeper than half a depth of a lower end of the second anode region, and the depth of the lower end of the second anode region is smaller than a thickness from an upper end to a lower end of the plurality of accumulation regions.

14. The manufacturing method according to claim 13, wherein a lower end of a deepest accumulation region of the plurality of accumulation regions is deeper than half a depth position of an adjacent trench portion of the plurality of trench portions, and has a depth which is the same as or shallower than a depth of a boundary between a sidewall region where the trench portion extends toward a rear surface of the semiconductor substrate, and a bottom region where a width of the trench portion decreases toward a bottom portion of the trench portion.

15. The manufacturing method according to claim 8, further comprising:

providing an accumulation region of the first conductivity type that has a higher doping concentration than a doping concentration of the drift region, wherein a lower end of the accumulation region is deeper than half a depth position of an adjacent trench portion of the plurality of trench portions, and has a depth which is the same as or shallower than a depth of a boundary between a sidewall region where the trench portion extends toward a rear surface of the semiconductor substrate, and a bottom region where a width of the trench portion decreases toward a bottom portion of the trench portion, a depth of a lower end of the first anode region is deeper than half a depth of a lower end of the second anode region, and the depth of the lower end of the second anode region is smaller than a thickness from an upper end to the lower end of the accumulation region.

16. The manufacturing method according to claim 1, further comprising:

providing an accumulation region of the first conductivity type having a higher doping concentration than a doping concentration of the drift region, wherein the accumulation region is provided below the first anode region and the second anode region.

17. The manufacturing method according to claim 1, further comprising:

providing a cathode electrode that is provided on a rear surface side of the semiconductor substrate; and providing a cathode layer that is provided in contact with the cathode electrode on a rear surface of the semiconductor substrate, wherein the cathode layer includes:

a first cathode region of the first conductivity type; and a second cathode region of the second conductivity type that is provided adjacent to the first cathode region.

18. The manufacturing method according to claim 17, wherein on the rear surface of the semiconductor substrate, an area of the second cathode region is greater than an area of the first cathode region.

19. The manufacturing method according to claim 17, wherein on the rear surface of the semiconductor substrate, an area of the first cathode region is equal to or smaller than 10% of a total area of the first cathode region and the second cathode region.

20. The manufacturing method according to claim 17, wherein providing the cathode layer includes:
   providing a rear surface side cathode portion that is provided in the semiconductor substrate; and
   providing a front surface side cathode portion of the second conductivity type that is provided closer to the front surface side of the semiconductor substrate than the rear surface side cathode portion is, and
   the rear surface side cathode portion has a repeated structure of the first cathode region and the second cathode region.

21. The manufacturing method according to claim 20, wherein the front surface side cathode portion is provided adjacent to the first cathode region and the second cathode region, and has an opening that is provided on a front surface side of the first cathode region.

22. The manufacturing method according to claim 21, wherein a diameter D of the opening is smaller than a width C of the first cathode region in a trench array direction.

23. The manufacturing method according to claim 1, further comprising:
   providing a connection portion for connecting the first anode region and the anode electrode, wherein the connection portion includes at least one of Ti, V, Ni, and Pt.

24. The manufacturing method according to claim 1, further comprising:
   providing a transistor portion that is provided in the semiconductor substrate.

25. A manufacturing method for a semiconductor diode, the manufacturing method comprising:
   providing an anode electrode on a front surface side of a semiconductor substrate;
   providing a drift region of a first conductivity type in the semiconductor substrate;
   providing a first anode region of the first conductivity type that is in Schottky contact with the anode electrode; and
   providing a second anode region of a second conductivity type that is different from the first conductivity type,
   wherein the first anode region has a doping concentration lower than or equal to a doping concentration of the second anode region, and is spaced from the drift region by the second anode region, and
   wherein a thickness of the second anode region in a depth direction below the first anode region is equal to or greater than 0.5 µm.

\* \* \* \* \*